(12) United States Patent
Hara et al.

(10) Patent No.: US 7,902,528 B2
(45) Date of Patent: Mar. 8, 2011

(54) METHOD AND SYSTEM FOR PROXIMITY EFFECT AND DOSE CORRECTION FOR A PARTICLE BEAM WRITING DEVICE

(75) Inventors: Daisuke Hara, Yokohama (JP); Katsuo Komuro, Ichikawa (JP); Takashi Mitsuhashi, Fujisawa (JP)

(73) Assignee: Cadence Design Systems, Inc., San Jose, CA (US)

( * ) Notice: Subject to any disclaimer, the term of this patent is extended or adjusted under 35 U.S.C. 154(b) by 238 days.

(21) Appl. No.: 11/603,527

(22) Filed: Nov. 21, 2006

(65) Prior Publication Data
US 2008/0116398 A1    May 22, 2008

(51) Int. Cl.
*G03F 7/20* (2006.01)
(52) U.S. Cl. ............. 250/492.22; 250/492.23; 430/30; 430/296; 430/942
(58) Field of Classification Search ............ None
See application file for complete search history.

(56) References Cited

U.S. PATENT DOCUMENTS

| | | | |
|---|---|---|---|
| 5,051,598 A | 9/1991 | Ashton et al. | |
| 5,241,185 A | 8/1993 | Meiri et al. | |
| 5,424,173 A | 6/1995 | Wakabayashi et al. | |
| 5,563,419 A * | 10/1996 | Tamura | 250/492.22 |
| 5,847,959 A | 12/1998 | Veneklasen et al. | |
| 5,863,682 A | 1/1999 | Abe et al. | |
| 6,107,207 A * | 8/2000 | Waas et al. | 438/707 |
| 6,243,487 B1 * | 6/2001 | Nakajima | 382/144 |
| 6,370,441 B1 * | 4/2002 | Ohnuma | 700/121 |
| 6,373,071 B1 | 4/2002 | Innes et al. | |
| 6,379,851 B1 | 4/2002 | Innes | |
| 6,646,275 B2 | 11/2003 | Oae et al. | |
| 6,720,565 B2 | 4/2004 | Innes et al. | |
| 6,815,693 B2 * | 11/2004 | Kamijo et al. | 250/491.1 |
| 7,205,078 B2 * | 4/2007 | Osawa et al. | 430/30 |
| 2003/0054580 A1 | 3/2003 | Yamamoto et al. | |
| 2004/0268289 A1 | 12/2004 | Sandstrom et al. | |

OTHER PUBLICATIONS

International Search Report and Written Opinion dated Mar. 13, 2008 for PCT/US2007/085137.
Abe T. et al., "Proximity effect correction for an electron beam direct writing system EX-7" J. Vac. Sci. Technol. B 7(6), pp. 1524-1527, Nov./Dec. 1989.
Magoshi S. et al., "Proximity effect correction on the multi-level interconnect metal for high-energy electron-beam lithography", Pro. SPIE vol. 5037, pp. 1035-1042, 2003.
Onigo K. et al., "3D Proximity Correction for Multi-Layer Structure in EB Lithography" Abstract of MNC2003, pp. 160-161-, 2003.
Takahashi. K. et al., "Proximity effect correction using pattern shape modification and area density map" J. Vac. Sci. Technol. B 18(6), pp. 3150-3157, Nov./Dec. 2000.
Lapanik et al. U.S. Appl. No. 11/607,753, filed Nov. 11, 2006.
Mitsuhashi, K. U.S. Appl. No. 11/678,530, filed Feb. 2, 2007.
Fujimura, A. et al. U.S. Appl. No. 11/603,603, filed Nov. 21, 2006.
Yoshida, K., U.S. Appl. No. 11/603,441, filed Nov. 21, 2006.

(Continued)

*Primary Examiner* — Jack I Berman
(74) *Attorney, Agent, or Firm* — Vista IP Law Group LLP

(57) ABSTRACT

A method of particle beam lithography includes selecting at least two cell patterns from a stencil, correcting proximity effect by dose control and by pattern modification for the at least two cell patterns, and writing the at least cell two patterns by one shot of the particle beam after proximity effect correction (PEC).

40 Claims, 20 Drawing Sheets

OTHER PUBLICATIONS

Yoshida et al. U.S. Appl. No. 11/607,305, filed Dec. 1, 2006.
Fujimura et al. U.S. Appl. No. 11/677,973, filed Feb. 2, 2007.
Hara et al. U.S. Appl. No. 11/603,526, filed Nov. 11, 2006.
Mitsuhashi,T. U.S. Appl. No. 11/226,253, filed Sep. 15, 2005.
Non-Final Office Action dated Dec. 4, 2009 for U.S. Appl. No. 11/677,973.
Kawano et al. "Technology of EB Lithography System for 65-nm Node Mask Writing", Hitachi Review, vol. 54 (2005), No. 1, pp. 37-41.
Sohda et al. "Recent progress in cell-projection electron-beam lithography", Microeletronic Engineering 67-68 (2003), pp. 78-86.

* cited by examiner

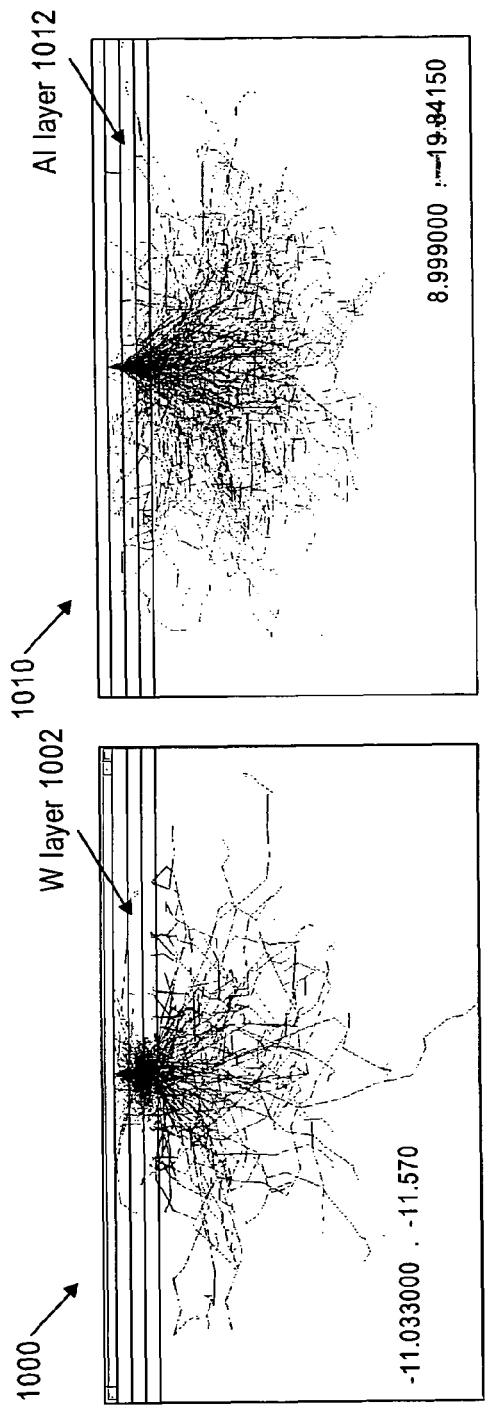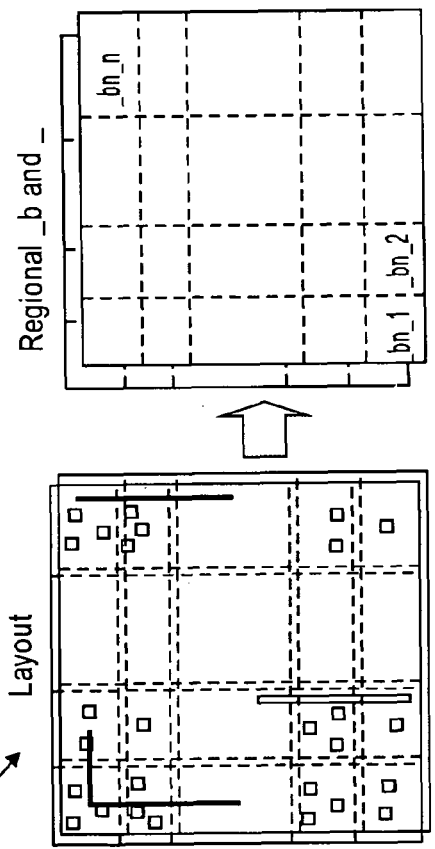
FIG. 10A
FIG. 10B

Proximity Effect Calculation by Proposed 2 Rect. Model

METHOD AND SYSTEM FOR PROXIMITY EFFECT AND DOSE CORRECTION FOR A PARTICLE BEAM WRITING DEVICE

BACKGROUND

1. Field

The field of the present invention relates to particle beam writing and lithograph technologies for fine image fabrication and, in particular, to a method and system for proximity effect and dose correction for a particle beam writing device.

2. Description of Related Art

In conventional semiconductor manufacturing processes for generating fine images on a plate by lithography, technologies like particle beam writers and an optical projection lithography method that uses a mask consisting of transparent and opaque parts have been used. The plate is coated by a particle beam sensitive resist. An example of a particle beam writer is an electron beam (EB) writer, which is used for writing fine images on both silicon wafers and glass masks for optical projection lithography. A technology that uses electron beam (EB) writers for making fine images for semiconductor integrated circuits directly on the semiconductor wafer is electron beam direct writing (EBDW) technology.

A fundamental problem with conventional lithograph technologies is image quality degradation and resolution limits caused by chemical and physical effects in the process of the technologies. The degradation or difference between obtained image and intended pattern becomes serious with fine images. Proximity effect is one of the most dominant issues among these effects.

In general, proximity effect correction is mandatory for the particle beam writer including electron beam writers. Proximity effect is a degradation or variation of the written image caused by scattering of incidence particles in resist or backscattering or reflecting particles from lower layers of the resist.

Conventional electron beam (EB) writers can write complicated patterns by one shot. Variable Shaped Beam (VSB) type EB writers can write any flexible predefined sized rectangle/triangle/trapezoid by one shot. Cell Projection (CP) type EB writers can write complex patterns defined on a stencil plate by one shot. However, the size of CP cells on the stencil plate has limitations. In general, the allowable size of commonly used CP cells is several microns by several microns.

FIG. 1 depicts an EB writer 100 that can draw patterns by means of both VSB and CP. An electron beam source 102 projects an electron beam 103 that is formed into a rectangular shape 108 with a rectangular aperture 104 formed in a first mask 106 or first shaping aperture and then is projected through a stencil aperture 110b formed in a stencil mask or plate 112. A cell pattern 114 is projected on a wafer surface or substrate 116 from the stencil aperture 110b of the stencil mask 112. As shown in FIG. 1, the stencil mask 112 includes various stencil apertures 110a, 110b, 111a, 111b, for both VSB and CP cell pattern write.

In both VSB and CP type writing, dose or number of charged particles, such as electrons, in a shot can be controlled by exposure time. The quantity of injected particles is called a dose. In general, a higher dose of charged particles provides larger images as a result. FIG. 2A shows a case in which the dose is low, and FIG. 2B shows a case in which the dose is high. As shown, a target pattern or region 200 in FIG. 2A is the same as a target pattern or region 202 in FIG. 2B.

However, due to different exposure times, an obtained image 212 of FIG. 2B is larger than an obtained image 210 of FIG. 2A.

Some proximity effect correction methods have been proposed. One method is a dose correction method that corrects proximity effect by controlling dose used for a VSB or CP shot. Another method is proximity effect correction (PEC) by pattern that corrects proximity effect by modifying writing patterns or adding auxiliary patterns. These auxiliary patterns are sometimes referred to as an assist pattern or dummy pattern. PEC methods that use pattern modification, such as slimming down or fatting up some parts of the pattern, and add serif to the pattern for obtaining intended images are also classified as a PEC method that uses auxiliary patterns. Hereafter, these types of correction methods are called Proximity Effect Correction (PEC) by pattern. FIGS. 3A and 3B depict examples of PEC by pattern. FIG. 3A shows a target pattern 300 and an obtained image 302 without PEC by pattern, and FIG. 3B shows a target pattern 310, an auxiliary pattern 312 and an obtained image 314 with PEC by pattern.

Some EB writers for mask writing are implemented with only VSB type functionality. PEC by a pattern method is not suitable for VSB type EB writers because pattern modification or auxiliary patterns increase the number of shots required, and as a result, writing time becomes longer. Therefore, the dose correction method is dominant for VSB type EB writers. On the other hand, by using CP cell type writer, plural patterns are written by one CP shot and dose correction among patterns in the CP cell or to use different dose for writing patterns in the CP cell is generally difficult to achieve.

FIG. 4 depicts a CP cell 400 and illustrates the substantial difficulty of dose collection in the CP cell 400. As shown in FIG. 4, CP cell 400 includes a cell boundary 402 and may comprise a plural patterns 404 written by a single EB shot. As a result of the above mentioned discussion, a problem occurs in which the width of the obtained images vary depending on the position in the CP cell 400, although target width is identical among those patterns.

FIG. 5 depicts the above mentioned case that shows images 404 in the CP cell 400 are fattened or made larger 500 by proximity effect. In general, correction of proximity effect by dose modulation is not achieved between patterns in the CP cell 400 because the images 404 are usually written in one shot.

Computing time is another issue for PEC. With the capability of current computers, more than several hours are required for correction of a layer. A commonly used conventional method is referred to as an Area Density (AD) method, which is an approximation method that uses a grid covering a whole chip area as a means of approximation. As shown in FIG. 6, the chip area 600 is divided into small grids 602 that consist of several micron by micron rectangles. The proximity effect calculation is approximated by Area Density (AD) of each grid, where Area Density is defined by the ratio of area of patterns in a grid to the area of the grid rectangle. In general, from the original layout pattern 610, the accuracy of the approximation 612 is controlled by adjusting the size of the grid 602 or dense grid-results with higher accuracy. If a coarse grid is selected, computing time will be decreased. A trade-off between accuracy and computing time is possible for this approximation model.

However, the area density (AD) method is not an accurate approximation. Another issue is that the division of a chip by the grid does not fit to the idea of writing by CP cell. As shown in FIG. 7, it is quite inconvenient that the grid for the AD method splits 700 a CP cell to form a grid boundary 702. The reason is that some parts of the CP cell need to be shot by a different dose. However, a CP cell is usually shot only once.

To resolve above mentioned issues, an accurate approximation model and method that are applicable to both CP and VSB writing is desired.

In recent trends for manufacturing semiconductor integrated circuits, increasing the number of metal layers for wiring should be considered, and the use of metal materials other than aluminum should also be considered. FIG. 8 depicts a sectional view of a recent semiconductor integrated circuit 800. The top layer 802 of the depicted structure is coated by electron beam sensitive resist 804. Conventionally, the scattering effect caused by reflection or collision of particles or electrons with wiring or via/contact material is not considered enough. Compared with aluminum as a conventionally used material, tungsten (W) 812, tantalum (Ta) and copper (Cu) 810 have high reflective characteristics. In case there is high reflective materials under the resist, particle or e-beam writing requires careful consideration for the proximity effect calculation affected by severe scattering environment.

FIGS. 9A-9B illustrate a calculation result, which reflects how the scattering parameter varies with the change of underlay structure of the resist. FIG. 9A shows an underlay structure of the resist that is assumed in the above calculation. The structure varies from 0 to 20 in terms of number of copper strip. FIG. 9B depicts how the parameter or ratio of reflected energy to incidence energy changes as a result of copper strip number variation. However, the conventional solutions are not practical because procedures for taking underlay structure effect into account are tedious and time consuming. Other aspects of this issue is that combination of vias and wires is diverse in structure and difficult to handle by a computer.

FIGS. 10A-10B show scattering of electrons and a scattering model. FIG. 10A shows a first layered structure 1000 with a Tungsten (W) layer 1002 and a second layered structure 1010 with an Aluminum (Al) layer 1012. Conventional modeling of scattering effect by simple grid 1020 covering semiconductor chip, as shown in FIG. 10B, is not a method that utilizes the predominance of writing by a CP cell. The reason for this weakness is that size and position of exposed regions by CP and VSB writing is not aligned with the model for scattering so that the scattering model is not directly usable for the writing. A more efficient scattering model or calculation method is required.

In general, the scattering model depends on the underlay structure of resist like metal wiring and vias. In other words, parameters given by the model are determined by layout patterns in each layer under the resist. However, it is not suitable to use layout patterns itself for generating the model because the patterns have diverse configurations. A more efficient means for modeling the layout under the resist and quick scattering parameter estimation is required. From a quality control point of view, to understand distribution of dose quantity over the chip area or intensity of dose at any point on the chip is substantially important.

SUMMARY

The invention presented herein relates to particle beam writing, lithograph technologies for fine image fabrication, and proximity effect correction. Examples of lithography technology by a particle beam writer include, but are not limited to, an electron beam (EB) writing device, an X-ray writing device and an optical (light) laser beam writing device. One fundamental problem with conventional photolithography technology is the image quality degradation from the intended patterns that is caused by proximity effects. This problem can be solved by a technology referred to as proximity effect correction.

In one embodiment, the invention presented herein relates to a proximity effect correction method that is simultaneously applicable to both variable shaped beam (VSB) and cell projection (CP) writing, which are used in particle beam writing systems including electron beam (EB) writing systems.

In another embodiment, the invention presented herein relates to a dose correction method based on a fast and accurate deposition energy calculation method that is applicable to both VSB and CP writing. The method is more accurate than conventional area density methods and reasonably fast compared with conventional methods. In one aspect, the invention presented herein includes a new model for the calculation and the model generation method.

In another embodiment, the invention presented herein relates to a scattering parameter calculation method that enables effective parameter estimation of backward and forward scattering of particles like electrons, which occurs in understructure of the resist.

In another embodiment, the invention presented herein relates to an intuitively understandable display method for dose correction and scattering parameter calculation.

In another embodiment, a method of particle beam lithography includes preparing a stencil having at least one group of patterns that are corrected for proximity effect by pattern modification, correcting the proximity effect by modifying a dose of particle beam shots for both VSB and CP mode writing, and writing a lithography image by using both VSB and CP mode.

In one aspect, edges of the patterns in the group of patterns are moved independently for the correction by pattern modification. The edges of the patterns in the group of patterns are moved at non-uniform distances for correction. At least one edge of the patterns in the group of patterns are split by an inserted vertex and a bend is generated at the vertex for PEC. Proximity effects between the patterns in the group of patterns are corrected by modifying shapes of the patterns in the group of patterns. Dose intensity for the PEC by pattern modification is made equal to a threshold value of the deposition energy that generates the images by the particle beam.

In another embodiment, a model generation method for proximity effect calculation includes preparing a group comprising at least two patterns and defining at least one representative pattern for approximating the proximity effect caused by the group of patterns.

In one aspect, a CP cell is used for the group of patterns. The PEC model includes a minimum circumscribing rectangle for the group of patterns and an area ratio of a total area of cell patterns in the group to an area of the minimum circumscribing rectangle. The PEC model comprises at least one representative rectangle for approximating the proximity effect caused by the group of patterns. The PEC model comprises at least one mathematical function that is characterized by asymptotically approaching zero with moving to the infinite for approximating the proximity effect caused by the group of cell patterns.

In another embodiment, a method of proximity effect calculation (PEC) for particle beam lithography includes selecting at least two patterns, clustering objective patterns of the at least two patterns into a pattern group, approximating the proximity effect of the pattern group by one or more representative patterns, and performing proximity effect correction (PEC) for the pattern group.

In one aspect, dose quantity of each pattern in the pattern group is copied from that of the representative pattern of the pattern group or is made equal to that of the representative pattern. The proximity effect calculation between patterns in the pattern group is achieved using each of the patterns in the pattern group.

In another aspect, the method may further include dividing objective patterns and calculating proximity effect of the divided patterns. Criteria for dividing objective patterns is determined by a size of a region that is written by the particle beam in one shot.

In another embodiment, a method of proximity effect calculation for particle beam lithography includes selecting at least two patterns from a writing data to form a pattern group, storing scattering parameters for the pattern group, retrieving the scattering parameters of the pattern group for calculating proximity effect, and performing proximity effect correction (PEC) for the pattern group or the pattern using the scattering parameters. In one aspect, a CP cell is used for the pattern group or a cell pattern for Variable Shaped Beam (VSB) is used for the pattern group.

In another embodiment, a method of particle beam lithography includes selecting a plurality of patterns from a layout data file to form a plurality of pattern groups, calculating scattering parameters for each pattern group, storing the scattering parameters in a storage medium in a manner so as to keep relations between the scattering parameters and the corresponding pattern group, retrieving the scattering parameters of each pattern group for calculating proximity effect, performing proximity effect correction (PEC) for each pattern group, and writing each pattern group after proximity effect correction (PEC).

In one aspect, composite scattering parameters for overlapped multiple layers of repetitively used pattern groups are calculated in advance and stored in the storage medium that keeps relations between the scattering parameters and the corresponding pattern group.

In another aspect, the method may further include transforming a structure of multiple layers into an equivalent structure that has less number of layers, generating a base model that comprises an equivalent layer and bulk silicon, and computing scattering parameters from the base model. The base model comprises an area ratio as an input, scattering parameters as output, and a model that calculates outputs as a function of the area ratio.

In another embodiment, a method of particle beam lithography includes dividing a writing region by a plurality of grid meshes, calculating scattering parameters of each grid mesh using underlay patterns in each grid mesh, storing the calculated scattering parameters in a storage medium in a manner so as to keep relations between each grid mesh and the scattering parameters, and computing required information in a data structure using the scattering parameters.

In one aspect, a same grid mesh is used in common through all layers, and the calculation of scattering parameters at a layer is performed using scattering parameters for the underlay structure.

In another aspect, the method may further include generating a predetermined model that calculates scattering parameters of a specified region using LSI design parameters of the specified region as inputs, and generating a procedure that returns the scattering parameter of a given position of the LSI layout by using the predetermined model. The method may further include generating an energy flux model that uses at least a kind of material used in each layer of the LSI, the thickness of each layer as inputs, and calculates the rate of particle energy flux transmitting and the rate of particle flux reflection. The method may further include a scattering parameter model that uses a kind of material used in each layer of the LSI, the thickness of each layer, and an area ratio that is defined as a ratio of area occupied by objective material to the area of specified region as inputs, and calculates backscattering range and backscattering energy ratio of backscattering to forward scattering energy. The method may further include dividing an objective region of the LSI by a plurality of grid meshes and calculating scattering parameters of each grid mesh. The method may further include extracting VSB patterns and CP cells located under specified VSB patterns or CP cells, calculating an area ratio, transforming multiple layers into an equivalent layer by using compensated area ratio, and calculating scattering parameters based on the compensated area ratio.

In another embodiment, a method of particle beam lithography includes correcting proximity effect by dose control, correcting proximity effect by pattern modification for the group of at least two patterns, and displaying information related to proximity effect correction (PEC) for the particle beam lithography by displaying the information at a position related to a layout pattern required by a operator. The information includes a proximity effect simulation image, correction results, parameters required for the proximity effect simulation and correction.

In one aspect, one or more representative patterns for approximating proximity effect of specified patterns, a value of calculated dose quantity and parameters required for proximity effect calculation are displayed by means of coloring of patterns and shape. A range related quantity of proximity effect is displayed by overlaying a figure in a scale similar to the displayed patterns by pointing to a pattern of interest.

In another aspect, the method may further include displaying dose quantity obtained by dose correction at a position related to the pattern and displaying an image obtained by the simulation based on the calculated dose in a position related to the original pattern of a chip area, wherein the information is displayed simultaneously or independently.

These and other objects and advantages of the present teachings will become more fully apparent from the following description taken in conjunction with the accompanying drawings.

BRIEF DESCRIPTION OF DRAWINGS

FIGS. 10A-10B show scattering of electrons and a scattering model.

DETAILED DESCRIPTION

Figure 1:
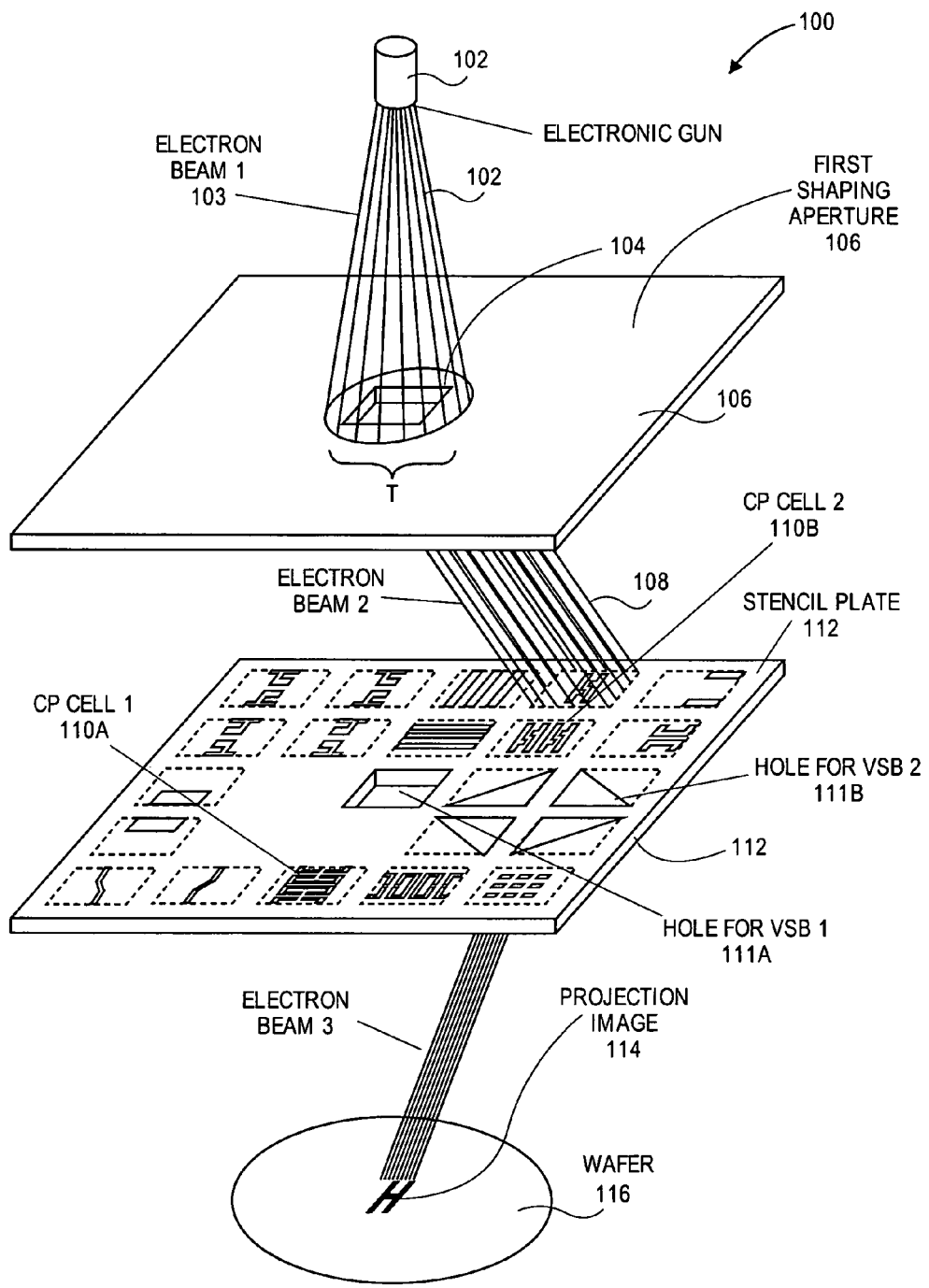
FIG. 1 shows a cell projection type particle beam writing device.
Figures 2A, 2B:
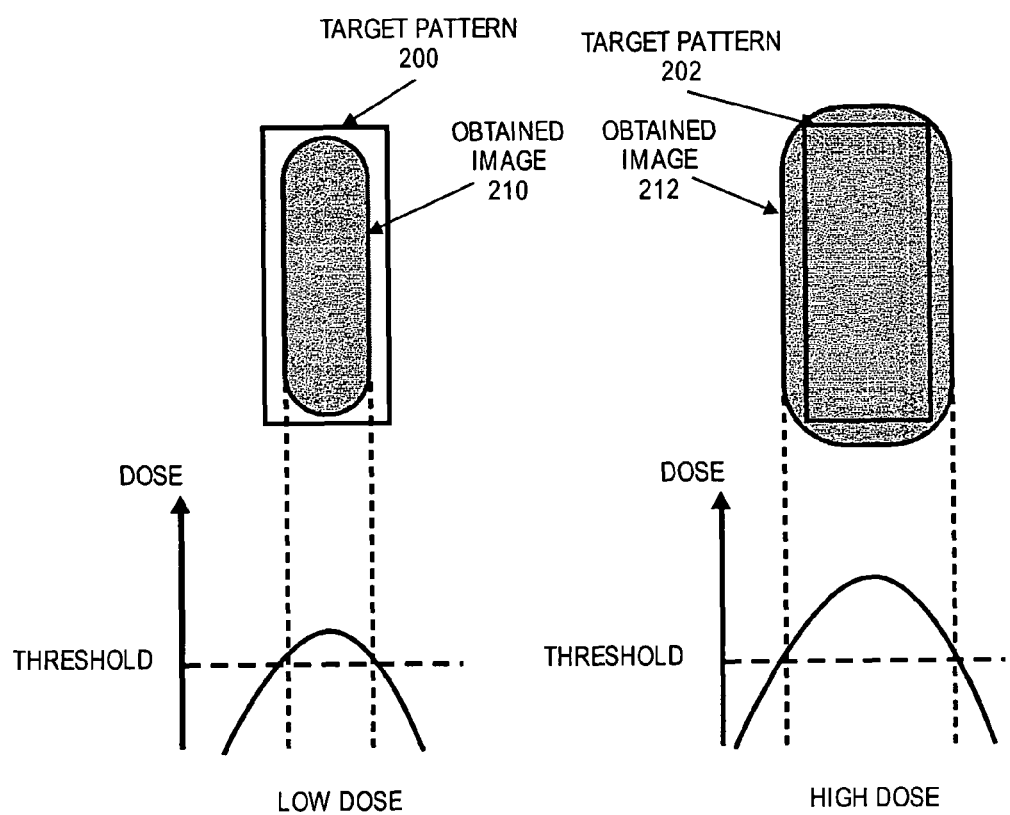
FIGS. 2A-2B show the change of projection image by dose.
Figure 3A:
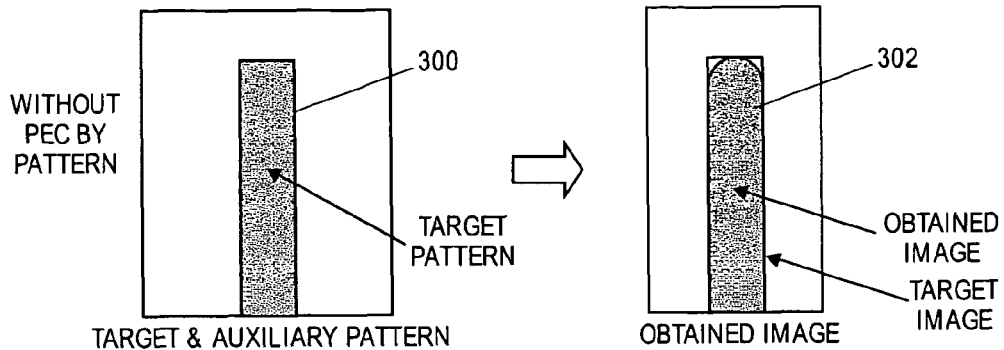
FIGS. 3A-3B show proximity effect corrections by an auxiliary pattern.
Figure 3B:
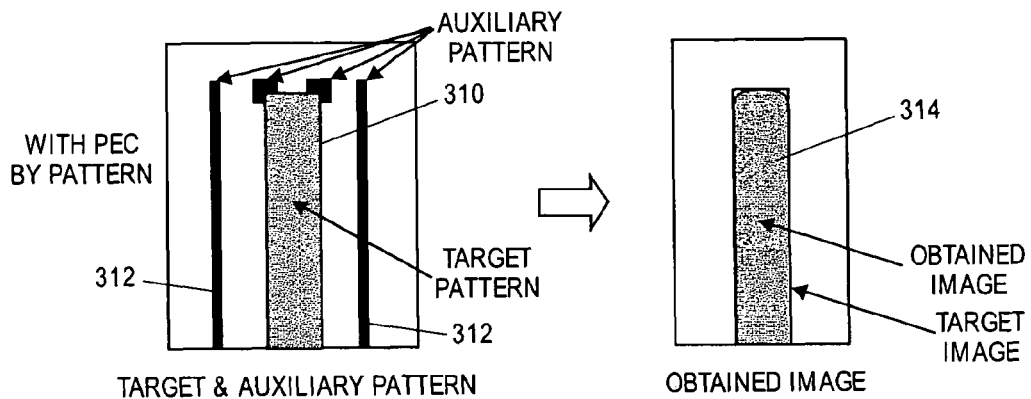
Figure 4:
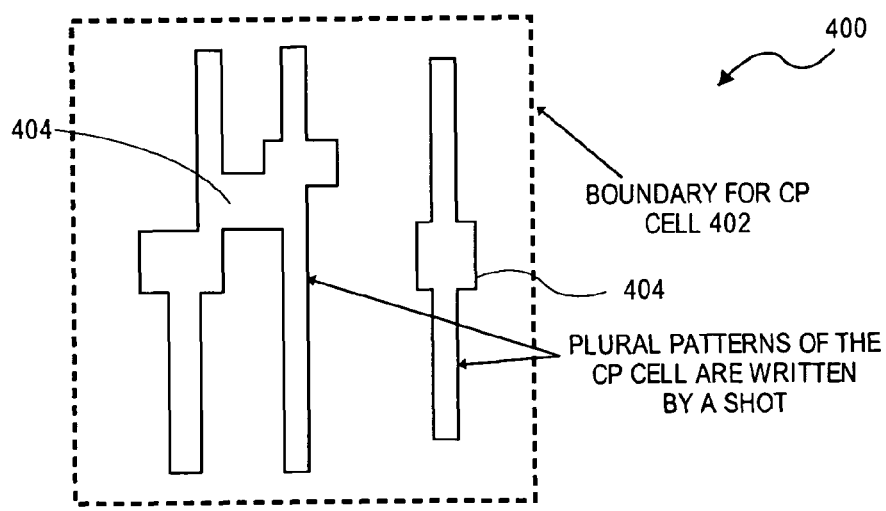
FIG. 4 shows an illustration of Cell Projection (CP).
Figure 5:
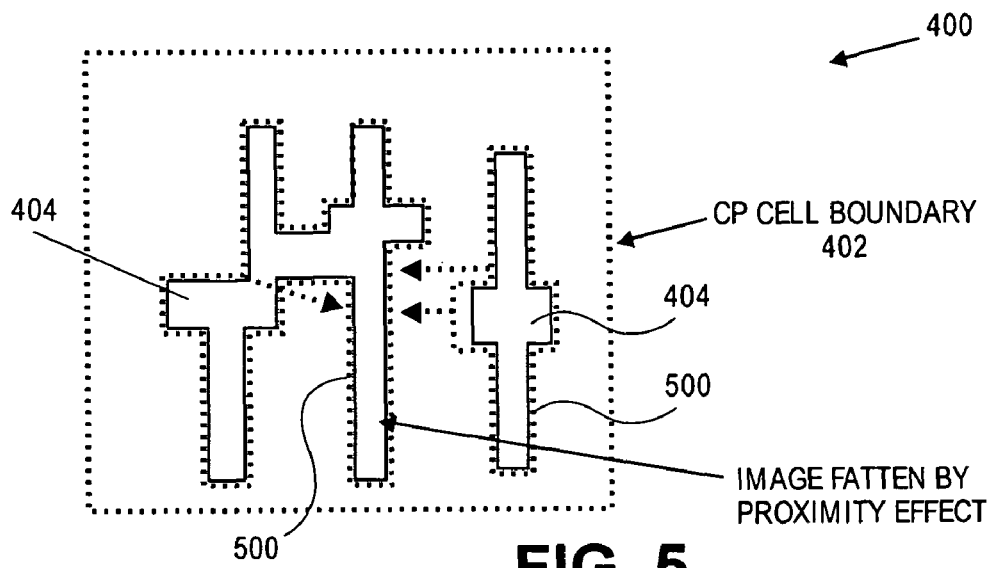
FIG. 5 shows proximity effect in CP.

Various embodiments of the invention are described herein with reference to the drawings. It should be noted that the drawings are not drawn to scale and that elements of similar structures or functions are represented by like reference numerals throughout the drawings.

In one embodiment, the invention uses both proximity effect correction by pattern modification and proximity effect correction by dose. A first step of this procedure matches an assumed dose quantity for PEC by pattern modification to the threshold of deposit energy that determines appearance of lithography pattern. In a next step, PEC by pattern modification is applied to CP cells. The following steps will be done for all polygons in a CP cell of interest.

(1) A polygon is broken into a set of line segments that are boundaries of the polygon.

(2) Evaluation points are set on the segments so that differences between target and obtained value of deposit energy at the evaluation points can be calculated.

(3) The segments are moved so that the total difference between target and obtained deposit energy becomes minimum.

In one aspect, CP cells corrected by the above procedure are implemented on a stencil. An assumed dose quantity for the PEC by pattern modification and the threshold value are used for the PEC by dose correction.

In general, proximity effect correction requires a large amount of computing time for the calculation. Simply reducing the CPU time without careful consideration causes problematic accuracy issues.

In one aspect, CPU time is consumed for calculating deposition energy $f_p$ that is described by (1), $$f_P(x, y) = k\left[\exp\left(\frac{-(x^2 + y^2)}{\beta_f^2}\right) + \eta_E \frac{\beta_f^2}{\beta_b^2} \exp\left(\frac{-(x^2 + y^2)}{\beta_b^2}\right)\right], \quad (1)$$

where, $\beta_f$: forward scattering range, $\beta_b$: backward scattering range, $\eta_E$: ratio of deposited energy, and k: constant. Using formula (1), deposition energy F(X, Y) in sensitive resist at position (X, Y) by domain D is expressed by integral (2), $$F(X, Y) = \int\int_D f_P(x, y) m(x, y) dx dy, \quad (2)$$

where m(x, y) is the function that indicates writing images, m(x, y)=1 if the point is irradiated, m(x, y)=0, if the point is not irradiated. In case that domain D is rectangle, equation (2) is solved in closed-form, and described in some articles [1-3]. According to the article [3], $$F_R(X, Y) = \quad (3)$$
$$A\left[\left\{erf\left(\frac{X - X_1}{\beta_f}\right) - erf\left(\frac{X - X_2}{\beta_f}\right)\right\}\left\{erf\left(\frac{Y - Y_1}{\beta_f}\right) - erf\left(\frac{Y - Y_2}{\beta_f}\right)\right\} + \eta\left\{erf\left(\frac{X - X_1}{\beta_b}\right) - erf\left(\frac{X - X_2}{\beta_b}\right)\right\}\left\{erf\left(\frac{Y - Y_1}{\beta_b}\right) - erf\left(\frac{Y - Y_2}{\beta_b}\right)\right\}\right]$$

where $F_R(X, Y)$ is deposition energy at point (X,Y) caused by rectangle domain defined by (X1,Y1) and (X2,Y2), A is a constant, $\beta_f$ is forward scattering diameter, $\beta_b$ is backscattering diameter and erf( ) is error function respectively.

For calculating deposition energy accurately at a: position (X, Y), we are required to calculate equation (2) or (3) for all patterns around (X, Y). From computing time point of view, it is impractical to do full chip dose correction by using (2) and (3) naively. To resolve this problem and invent fast deposition energy calculation method is one of the most important factors in developing practical proximity effect correction. In one aspect, this calculation method is also applicable to lithography simulation; dose simulation and other areas.

Figure 6:
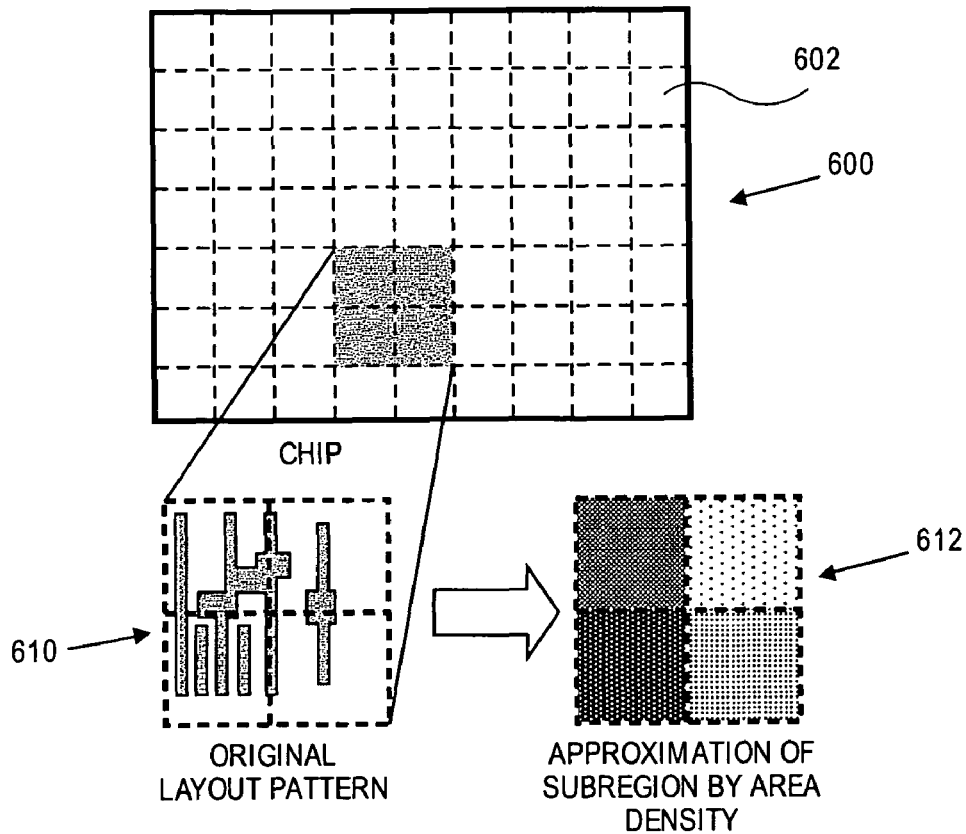
FIG. 6 shows approximations by Area Density (AP) method.

In conventional area density method shown in FIG. 6, regions for target of proximity effect correction is divided by mesh grid in same size. So that the size of the rectangle that will be a denominator of the area density value, is always fixed and equals each other. By virtue of this uniformity, it is easy to calculate proximity effect from a mesh grid to other mesh grids based on area density method. In actuality, to calculate equation (3) in advance for several patterns depending on configuration, and then just multiply area density for calculating proximity effect from a mesh grid to another mesh grid are done for the conventional method. This uniformity of mesh grid reduces required computation of equation (3) and is very efficient for reuse of calculated results. However, as mentioned, it is not easy to describe that match e-beam writing method by CP cell.

In one embodiment, an approximation method that is referred to as Bounding Box Area Density Method is presented herein, that is applicable to CP cell method and has simplicity of area density method. In this invention, as will be described in greater detail below, the approximation model comprises a Bounding Box that is defined as a minimal circumscribed rectangle of objective patterns, and an area ratio of total objective pattern area to the area of the Bounding Box.

By this definition, the objective patterns might be written by one shot but not limited to it. Quantity of the proximity effect like deposition energy at a point (X, Y) is calculated by the product of value by formula (3) using coordinates of the vertex of the Bounding Box and the area ratio.

Figure 11:
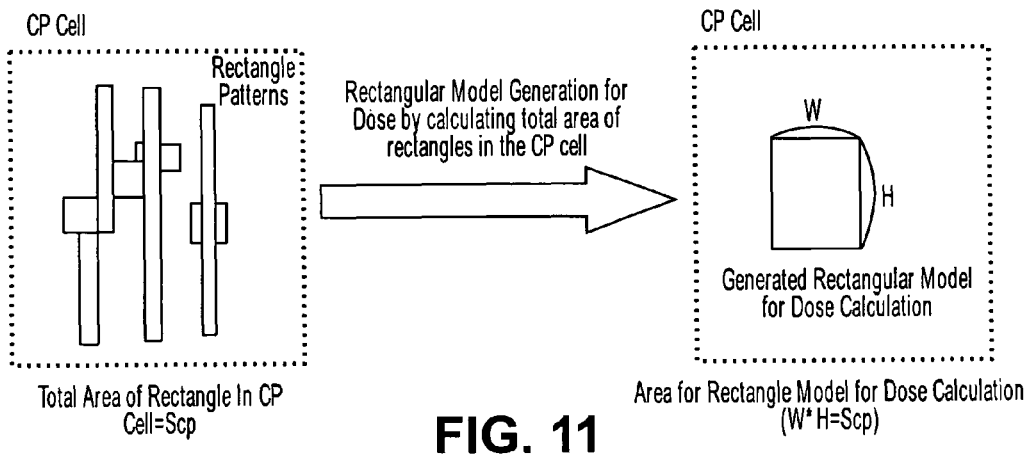
FIG. 11 shows generation of a rectangular dose model for CP.

In another embodiment, an approximation model that is referred to as Representative Rectangle Method is presented herein. The Representative Rectangle Method is characterized by a Representative Rectangle that has an area equal to the total area of the objective patterns that is written by one shot, and the shape is similar to the Bounding Box. In this method, the Representative Rectangle is placed by the center of gravity of the objective patterns. In the Representative Rectangle Method, a quantity of the proximity effect, such as deposition energy at a point (X, Y), is calculated by formula (3) using coordinates for the Representative Rectangle. FIG. 11 depicts a procedure for generating the model.

Figure 12:
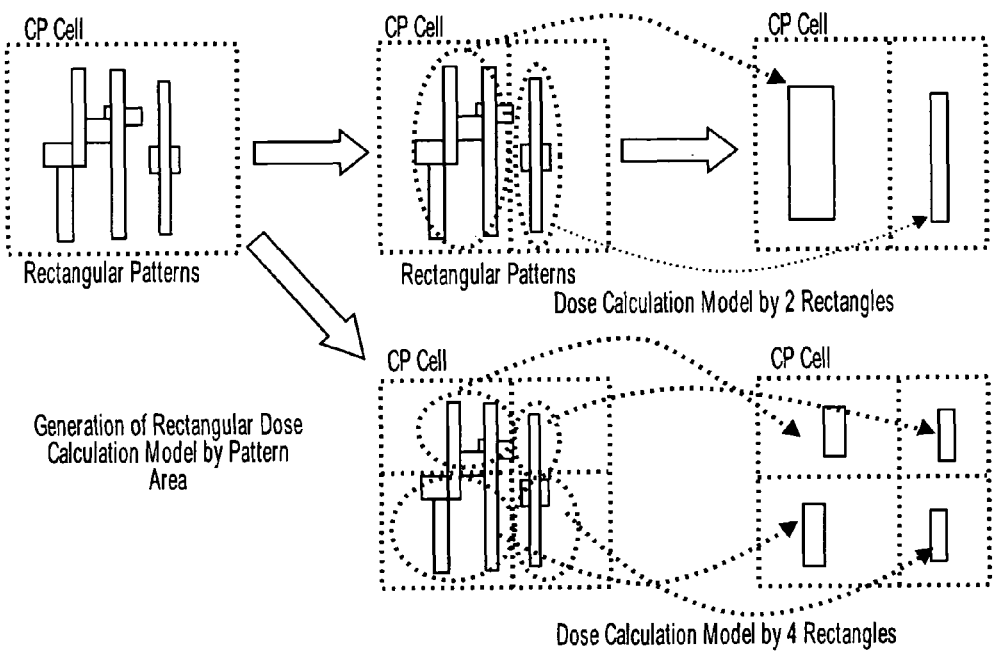
FIG. 12 shows a dose calculation model for CP cells by plural rectangles.

In one embodiment, as an advanced form of the Representative Rectangle Method, another method that splits the Bounding Box into plural sub-Boxes, and places the Representative Rectangle in each sub-Box is presented herein, in which the Representative Rectangle is generated by the similar Representative Rectangle Method. FIG. 12 depicts a procedure for generating the proposed model described herein that is applicable for a group of relatively complex patterns. As a nature of this approach, the approximation becomes more accurate with increasing number of split sub-Boxes. The approximation method comprises splitting a group of patterns into sub-groups and generating representative rectangles using a method similar to the Representative Rectangle Method, which is hereafter referred to as high order Representative Rectangle Method.

Figure 13:
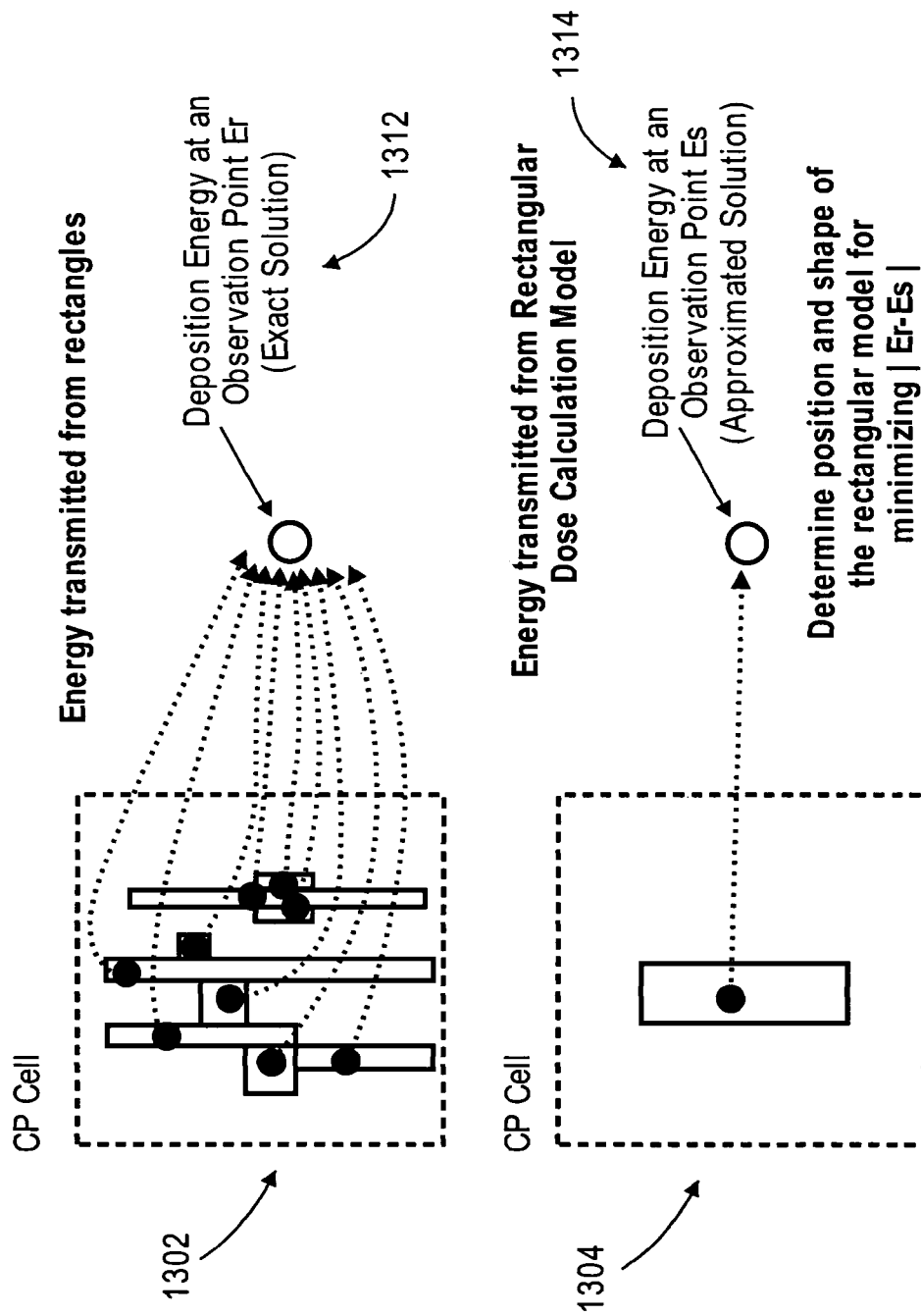
FIG. 13 shows generation of a rectangular dose model for CP.

By adjusting position and size of the representative rectangles of the high order or ordinary Representative Rectangle Method, it is possible to generate a highly accurate model. In one embodiment, FIG. 13 depicts a principal of such an idea. The upper part 1302 of FIG. 13 shows a CP cell that consists of 9 rectangles. The lower part 1304 of FIG. 13 shows only one rectangle in the CP cell that is refereed to as a representative rectangle. The position (X, Y) and height H and width W of the representative rectangle can be adjusted. A quantity of the proximity effect or deposition energy at a point 1312, which is Er or is referred to as exact value, as shown in the upper part 1302 of FIG. 13, is sum of each 9 rectangles by formula (3). Approximate value or Es that is contribution of the representative rectangle to an observation point 1314 is obtained by using formula (3). In one aspect, Es is a function of position (X, Y) or distance between the observation point and the rectangle, and H, W of the rectangle.

In one aspect, it is desirable as an approximation to minimize error at an observation point that is determined by square of difference between exact value Er and approximate value Es, or (Er−Es)². Moreover, many observation points as much as possible, such as N, makes the approximation more robust.

For example, let the number of observation points be i=1, . . . , N, exact value at the point be $Er^i$, approximate value at the point be $Es^i$, the problem is to determine variable X, Y, H, W so as to minimize an objective function E(X, Y, H, W). The objective function is expressed as:

$$E(X, Y, H, W) = \sum_{i=1}^{N} (E_r^i - E_s^i(X, Y, H, W))^2. \quad (4)$$

The problem is to determine X, Y, H, W so as to minimize (4). This is a nonlinear optimization problem. In one embodiment, as described herein, the problem with four dimensions is treated as a one dimensional problem by tentatively fixing the other three dimensions, and the one dimensional problem is successively solved by changing a variable in the free dimension. The problem is treated as one dimension and can be solved by line a search method that does not use a gradient calculation. In one aspect, X, Y, H, and W have constraints based on those geometrical properties.

For a higher order Representative Rectangle Method that has more than two sub-Boxes, a method similar to the above mentioned method is applicable, and accuracy improvement of approximated value by adjust position and size of the representative rectangles is possible.

Figure 14:
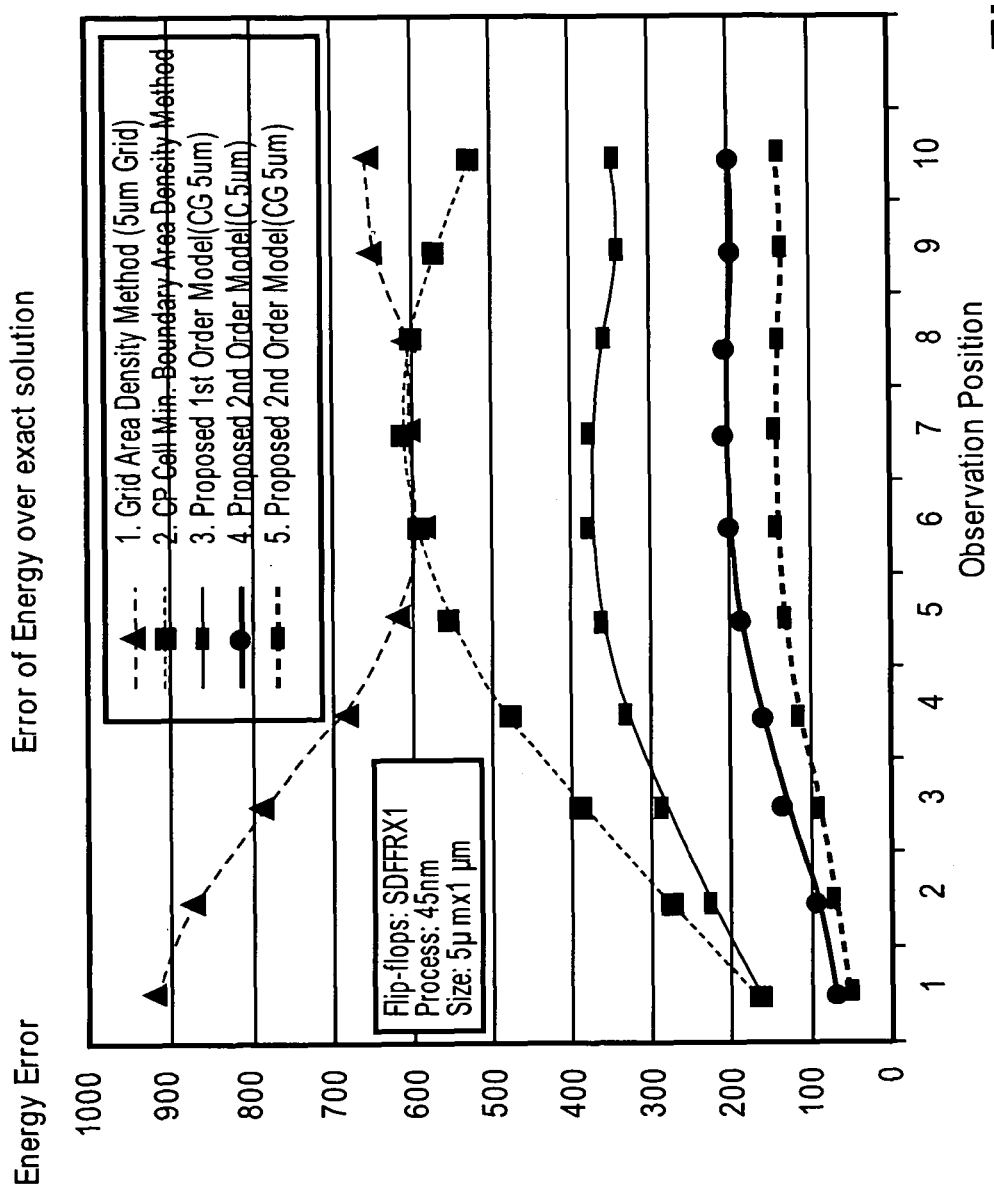
FIG. 14 shows relative energy errors.

FIG. 14 is an experimental result for comparing errors caused by each method presented herein. A flip-flop cell is selected as an object for evaluation and five observation points are set for the optimization. The conventional Area Density Method with 5 um×5 um grid shows the lowest accuracy in evaluated methods. Compared to the conventional one, the Bounding Box Area Density Method shows fairly good result in spite of lack of optimization technique. Resulted errors of ordinary and high order Representative Rectangle Method are also shown. The Representative Rectangle Method uses one rectangle and the high order one uses two rectangles for the approximation. For high order Representative Rectangle method with two rectangles, dependency of initial solution is shown for comparison. One is started from placing the rectangle at the center of the bounding box and the other is started from placing the rectangle at center of gravity of the patterns. In both cases size of the rectangle is equal to the total area of the patterns. In this comparison, starting from center of gravity gives a good result.

In the above discussion regarding the invention, it is explained by terms of geometry and patterns like shape, size, position, and so on. It is obvious from the formula (3) that similar discussion on the proximity effect and rectangles using mathematical terms and functions is possible. Proximity effect or deposition energy of complex patterns that consists of many rectangles is provided by sum of formula (3) using size and position of the rectangles. If this sum of formula (3) is approximated by simpler function, the computing time will be reduced tremendously. Considering the property of formula (3), the simpler approximate function obviously selected from a class of function that is asymptotically reaching zero when move away from the group of patterns.

It is obvious that the computation time for the proximity effect (for e-beam writer case deposition energy of electron) and the proximity effect correction is reduced by using these proposed approximation methods. The reason for this is reduction of number of patterns for evaluation.

Other embodiment of the invention is optimum mix of the approximation models or switching use of the model depending on the CP cell size to improve accuracy of the calculation with reasonable computing cost. For relatively small group of patterns or small CP cell, approximation by one representative rectangle gives reasonable accuracy. On the other hand, relatively large group of patterns or large CP cell like complex flip-flop circuit requires the use of plural representative rectangles for approximating the effect with reasonable accuracy. By using both approximation methods together, accuracy of the calculation and low requirement for computing resource are achievable.

In the previous session, some invention regarding the proximity effect calculation method for a group of patterns that might be written by one shot have been discussed. However, the idea of this invention is applicable for wider filed of calculation related to the proximity effect. In case that there are many relatively small patterns for writing, a method consists of clustering these small patterns by spatial neighborhood, and approximating the proximity effect by some representative patterns is invented. The idea of approximating the proximity effect caused by a group of neighboring patterns in the distance by one rectangle, is well justified for calculation. The assumption that spatially neighboring patterns will be given same dose quantity for writing is also acceptable.

Based on the above discussion, efficient and accurate calculation of proximity effect by approximation is applicable not only to CP cell writing but also to the wider area of e-beam writing. In one embodiment, the method of proximity effect calculation comprises a step of clustering objective patterns into a pattern group by spatial neighborhood and a step of approximating the proximity effect of the pattern group by few representative patterns. One concept of the invention, such as how to generate representative pattern, is well described herein and in reference to an approximation model for speed improvement. By virtue of this approximation scheme, it is possible to significantly reduce computing time without sacrificing accuracy.

Figure 15A:
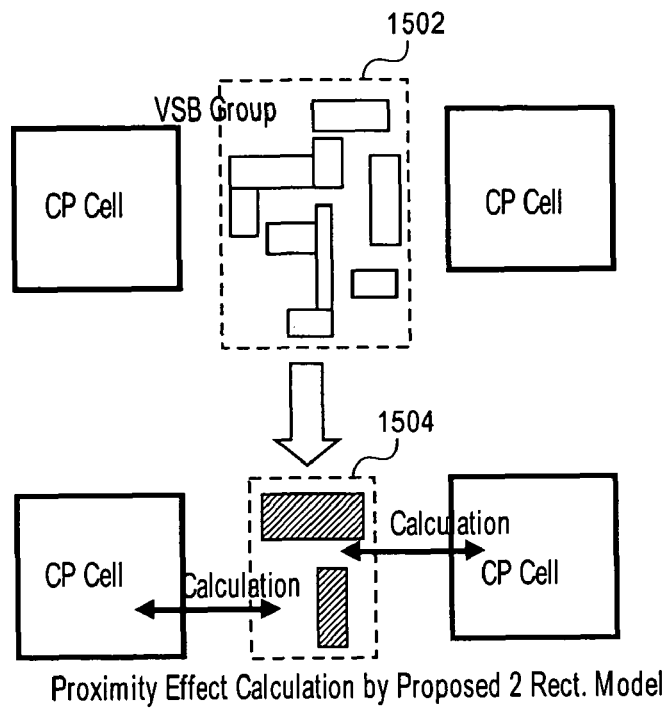
FIGS. 15A-15B shows various embodiments of an application of the invention presented herein to a Variable Shape Beam (VSB) case.

FIG. 15A depicts a case in which a group of VSB patterns 1502 is approximated by two representative patterns 1504 in a mixed CP cell and VSB writing circumstance. The idea of approximation by clustering is also applicable to both dose correction and proximity effect correction. In the correction methods, as a nature of the approximation algorithm, correction results are obtained for the representative patterns 1504. Because of the mentioned reason, correction results for the representative patterns 1504 must be fed back to the member of the group that is represented by the pattern. In a plural representative pattern case, different correction results might be assigned to each representative pattern. Again, feedback of multiple correction results issue occurs. In this case, the sub-Box generated by the approximation will help copying back correction results to patterns.

Figure 15B:
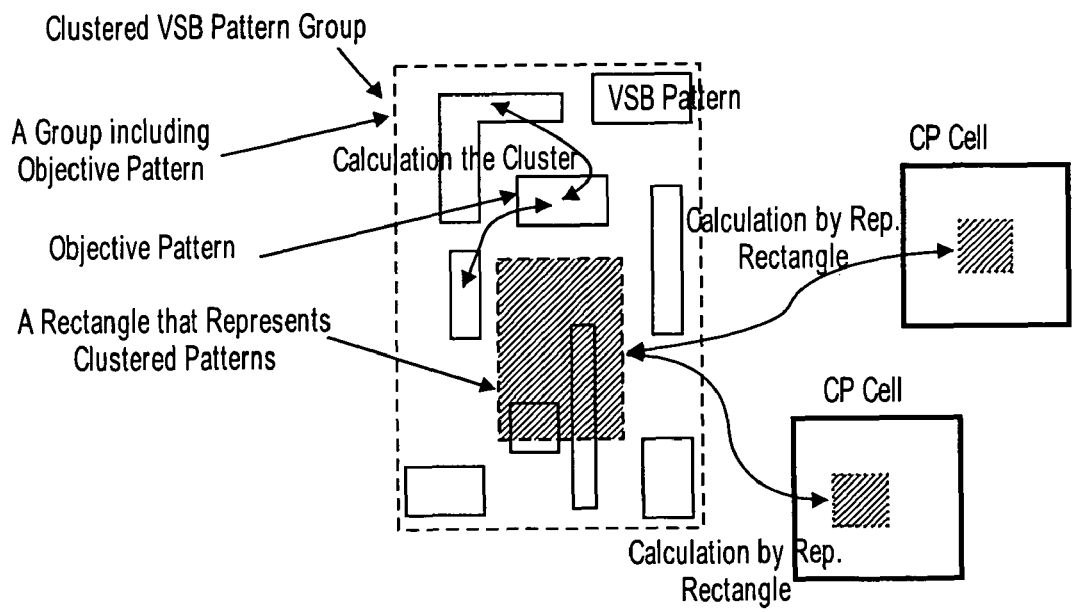

Referring to FIG. 15B, another embodiment of the invention is related to proximity effect correction by clustering while aiming for a higher order of accuracy. Considering a situation in which many patterns to be written by VSB are in the objective area for the proximity effect correction. Similar to the previous section, proximity effect correction consists of clustering patterns, generating the representative patterns and making correction between representative patterns is possible. A distance between patterns in a group generated by clustering is shorter than the distance between patterns in different groups. The following idea is reasonable for reducing CPU time with minimum sacrifice of accuracy. The method is characterized by a way of proximity effect calculation, in which the calculation between patterns in a same group is done using the patterns in its own group, and the calculation between patterns in different group is done between objective pattern that will be corrected and representative patterns of other groups. Size of area written by one shot of e-beam writing equipment exposure is limited by the hardware or a size of rectangular hole at first shaping aperture. As a method of cluster generation, use of hierarchy that is kept by the design is possible. By this approach, a high quality clusters are effectively generated.

Figure 15C:
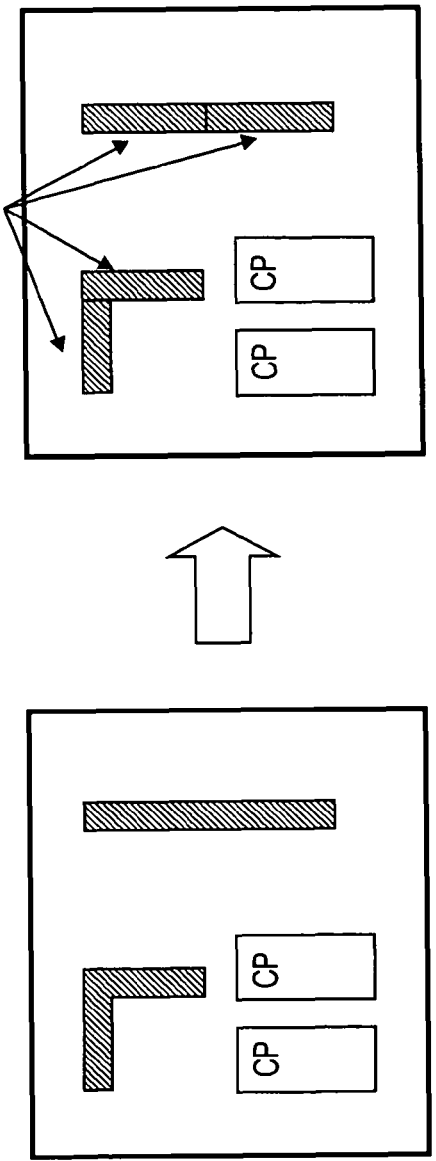
FIG. 15C shows fracturing of a polygon to a VSB pattern.

FIG. 15C depicts an example of breaking large patterns into VSB patterns that is writable for e-beam writing equipment. Size of area written by one shot of e-beam writing equipment exposure is limited by the hardware or a size of rectangular hole at first shaping aperture. A maximum size of the image on the wafer is about several microns by several microns even in recent technologies. On the other hand, it is not rare that length or width of layout patterns to be written on the wafer for semiconductor manufacturing exceed several millimeters. By this fact, a case that requires breaking layout patterns into a size of VSB hole frequently occurs. A technology that allows efficient breaking of large patterns into less than a specified size is required.

The invention provides a means for accurate and efficient writing compared with conventional writing by VSB, and a means for doing dose correction and simulation under condition of mixing writing pattern for VSB and representative patterns for clustered VSB patterns.

Large patterns that exceed VSB size are broken into small ones. This pattern breaking procedure is usually referred as fracturing. In most case, a pattern is fractured into a set of rectangles. In case of diagonal pattern, however, trapezoid, triangle or approximation of a diagonal pattern by fragmented rectangles is required. Using VSB holes, e-beam writing equipment can write a complex pattern that has non-orthogonal edges, but dose correction of such non-orthogonal patterns is not easy. The conventional Area Density method is difficult to apply to the correction of mixture of CP cell and VSB writing. To write patterns more accurate, fine fracturing of the pattern is preferable, but number of VSB patterns increases by this approach and results in increasing computing time for dose correction and increasing writing time of e-beam writer.

The invention described here is characterized by splitting objective patterns, clustering VSB patterns, generating one or more representative rectangle(s), dose correction for the writing patterns and proximity effect simulation for lithography by e-beam writing equipment for reducing dose correction and writing time.

There is a trade-off between accuracy of writing image and computing time for the correction, which can be controlled by fineness of the fracturing, accuracy of the used model. Those parameters can be controlled either manually or automatically. The calculation results of dose correction, the proximity effect simulation and other important information is shown on the display.

Figure 8:
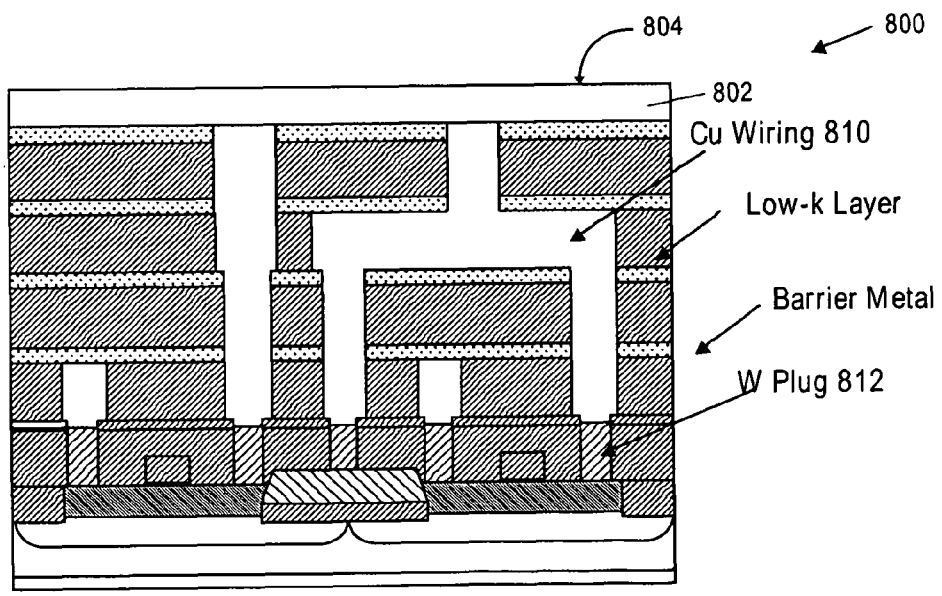
FIG. 8 shows a cross-sectional example of semiconductor device.
Figure 9B:
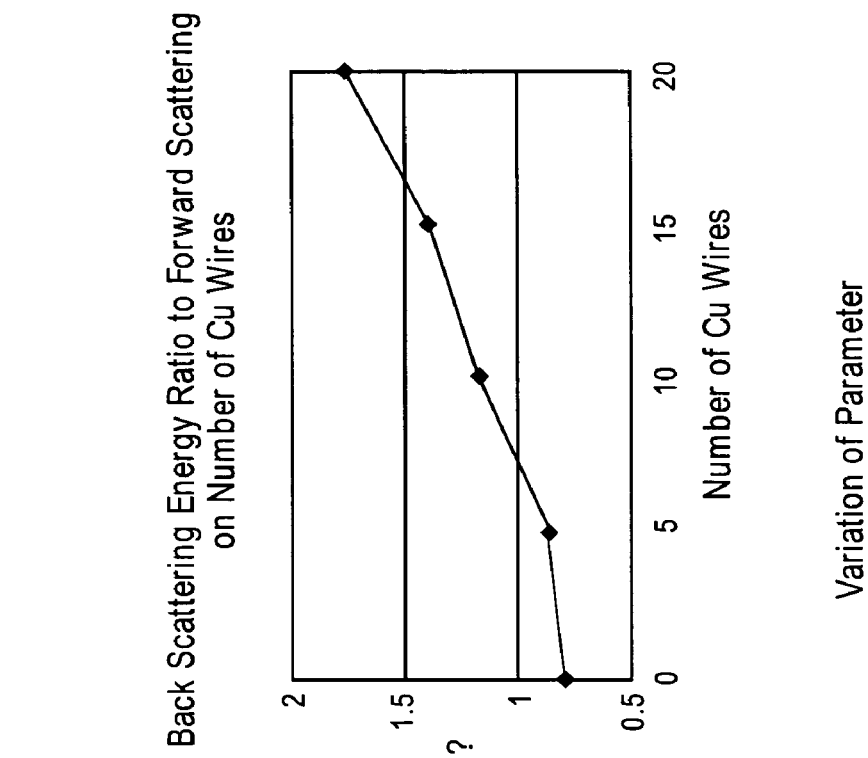
FIG. 9B graphically shows the change of ratio of reflected energy to incidence energy.
Figure 9A:
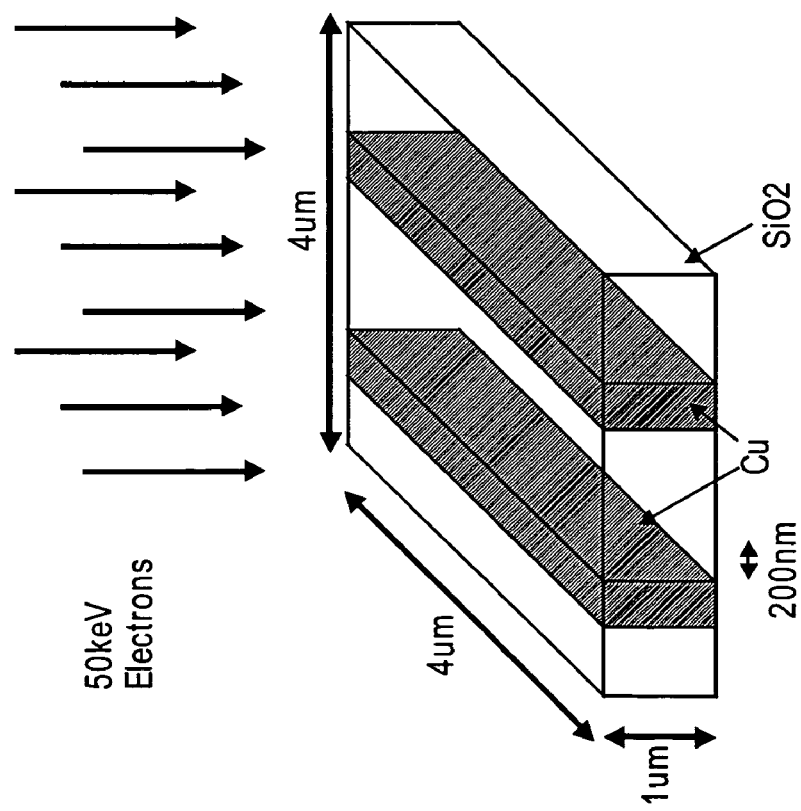
FIG. 9A shows variation of a scattering parameter by an underlay structure.

Referring to FIG. 10A, electrons injecting to the surface of semiconductor integrated circuits (IC) make collision and scattering with materials of the IC. Some of incidence electrons return to the surface of the IC by reflection of the electrons. Some of these reflected and incidence electrons interact with resist on the surface of the semiconductor and make latent image. Backscattering issue becomes more and more serious with increasing use of multi-metal layer wiring as shown in FIG. 8, and use of heavy metals that have large atomic number like Tungsten, Tantalum, and Copper. Actually, as shown in FIGS. 9A-9B, scattering parameters of electrons change depending on understructure of the resist. FIG. 9B shows ratio of backscattering energy to forward scattering that significantly varies depending on number of copper wiring under the resist. FIG. 9A shows typical understructure of the resist. In this case, number of copper wiring varies from 0 to 20.

Scattering issues of particles like electrons have large influence on proximity effect correction and dose correction of lithography. It is a serious problem, especially manufacturing of semiconductor ICs by using multi-metal layers for wiring and using Tungsten for understructure. For dose correction and proximity effect correction, scattering parameter that varies depending on a region for the correction must be considered. The parameters include forward scattering range, backscattering range, and reflection rate of backscattering energy to forward scattering energy.

A model depicted in FIG. 10B is the technology that partly satisfies above mentioned requirement. In this model, objective region for the dose correction is divided by grid and the value of scattering parameters is assigned to each grid. By using parameters assigned to each region, appropriate dose and proximity effect correction which considered local characteristics of scattering effect can be obtained. For conventional correction method like area density method that uses mesh, several benefits are created by aligning the scattering parameter estimation mesh to the correction mesh. It is natural approach to divide objective region and to estimate the scattering parameters of the each region for approximating complex distributed problem. This approach is also effective for reducing the complexity of the problem. In the case when only VSB shots are used, the described method has predominancy.

Figure 7:
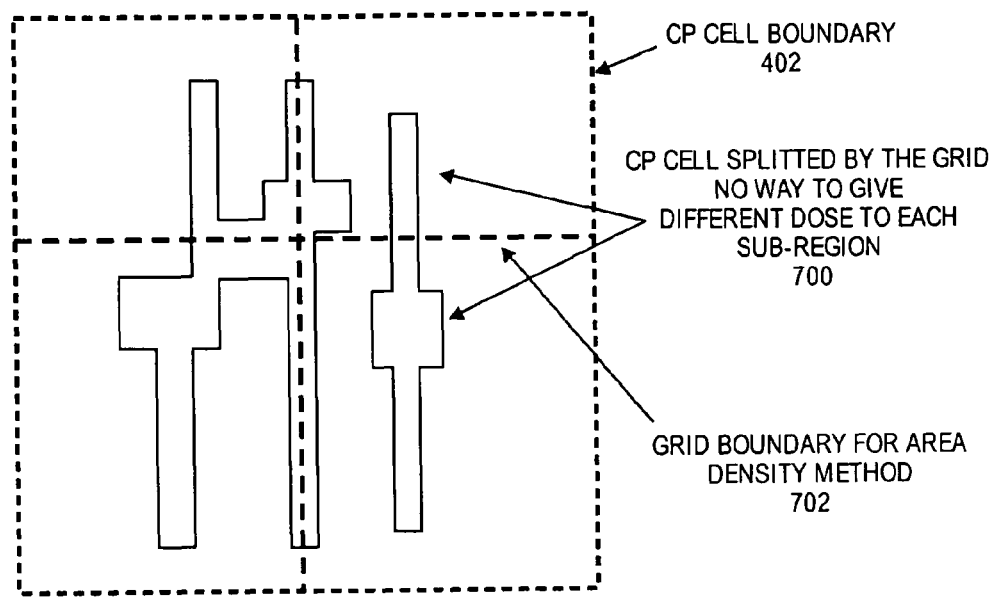
FIG. 7 shows CP cell and Area Density (AP) method.
Figure 21:
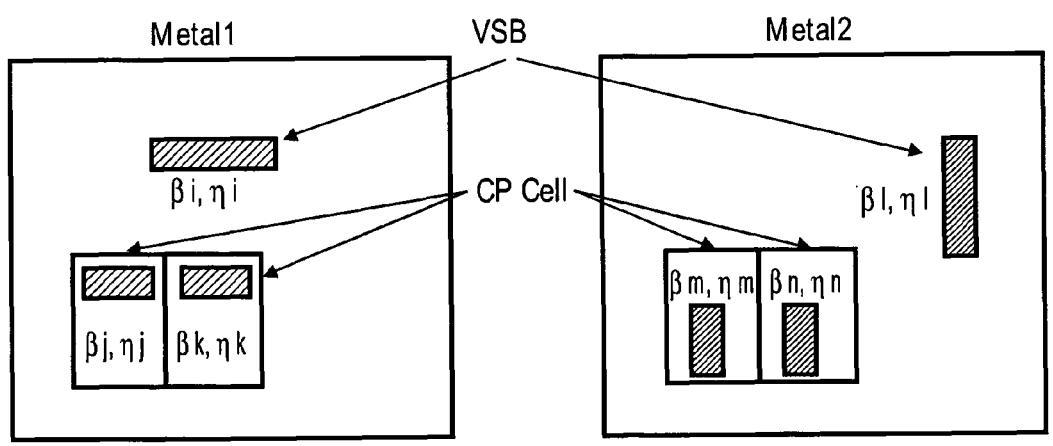
FIG. 21 shows scattering parameters corresponding to VSB and CP.

In case that CP cell is used for writing, dividing the area by mesh is not always preferable as shown in FIG. 7. That is, splitting a CP cell and giving dose to each part of the CP cell is impossible. It is not realistic that different scattering parameters are assigned to different parts of the pattern that will be written by one shot. A new scattering parameter estimation method that handles the problem for pattern(s) written by one shot, not dividing it by mesh, is presented herein for proper treatment of writing by CP cell. FIG. 21 depicts how the scattering parameters are assigned to each CP cell and VSB pattern by this invention. Scattering parameters are calculated for each CP cell and VSB pattern, and stored in storage with keeping relation to the writing objects like CP cell and VSB pattern. The stored scattering parameters are retrieved when evaluations for the dose or proximity effect correction of the related CP cell or VSB pattern is required. By this invention, shots by the writing equipment are directly related to the scattering parameters.

Figure 16:
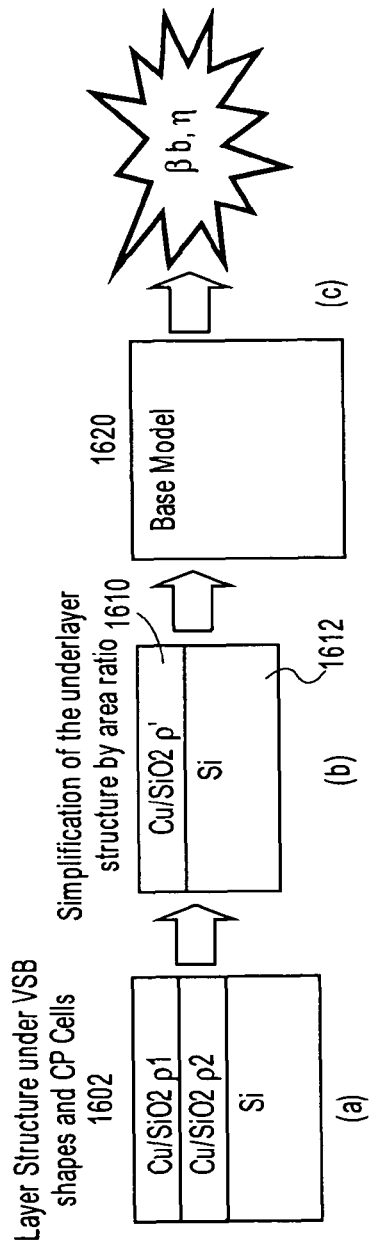
FIG. 16 shows a procedure for scattering parameter calculations.
Figure 20B:
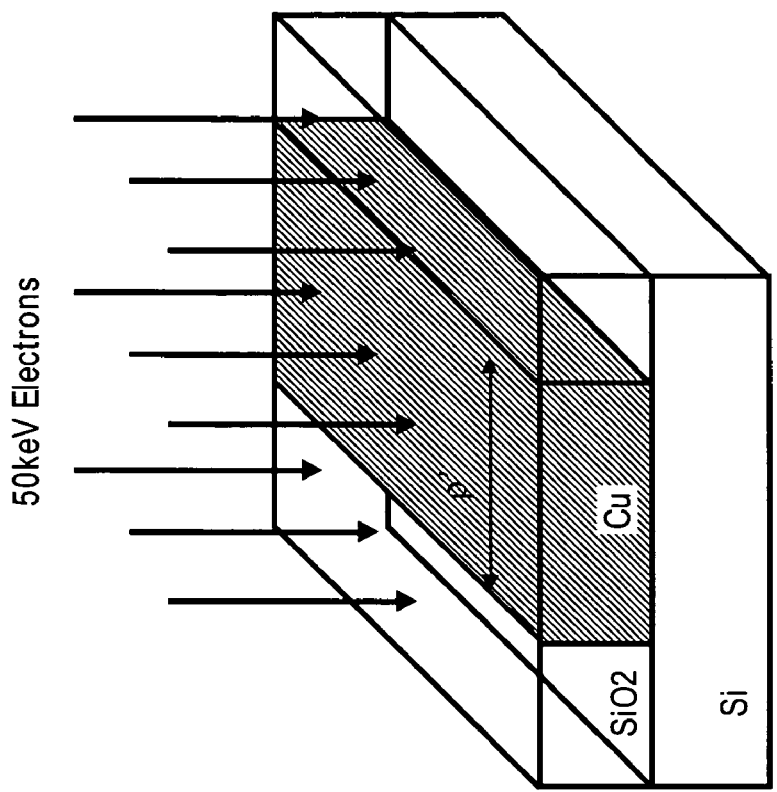
FIGS. 20A-20B show relations between base model, area ratio and scattering parameters.
Figure 20A:
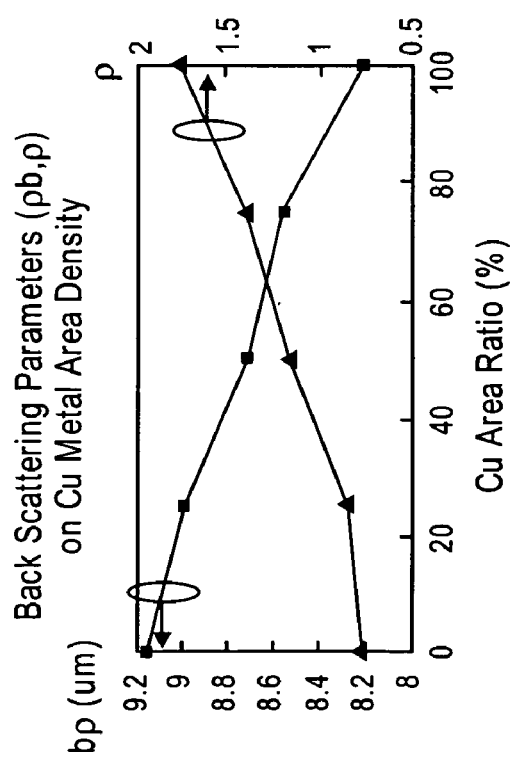

As shown in FIG. 8 for example, there is diversity in cross-sectional views for semiconductor IC. The cross sectional structure of the IC depends on the position of the chip. From practical point of view or computing time point of view, it is difficult to calculate scattering parameters from physical principle. The invention of efficient and practical scattering parameter calculating method that is applicable for variety of the cross sectional structure of IC is expected. The invention described here meets such a chip level estimation demand FIG. 16 depicts an outline of scattering parameter calculation method by the invention. The complicated layer structure 1602 of the objective area for calculation is successively reduced to a base structure 1603 that consists of a $Cu/SiO_2$ layer 1610 and bulk silicon 1612, in which $Cu/SiO_2$ layer consist of Cu and $SiO_2$ parts with ratio of $\rho'$: $(1-\rho')$. $\rho'$ is referred as effective area ratio. Backscattering parameters are calculated by a base model 1620 using the base structure 1603 and $\rho'$. As depicted in FIGS. 20A and 20B, parameters like backscattering range $\beta_b$ and energy ratio $\eta$ are easily calculated by the base model, if effective area ratio $\rho'$ and thickness of the $Cu/SiO_2$ layer are given. The base model is characterized by a scattering simulator and represented by a table that yields the parameter $\beta_b$ and $\eta$, given $\rho'$ and thickness of the $Cu/SiO_2$ layer as inputs.

Figure 17:
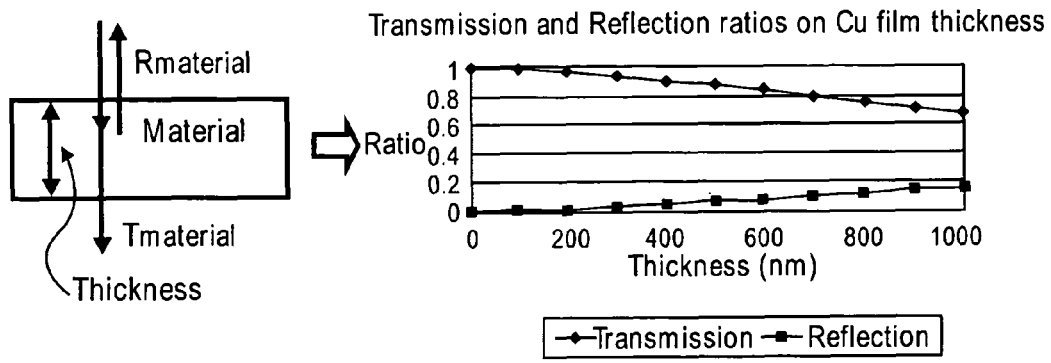
FIG. 17 shows a representation of a scattering model and parameters therefore.

A layer reduction procedure that is depicted in FIG. 16 is described here. Consider a problem of reducing two $Cu/SiO_2$ layers (area ratio of Cu is $\rho_1$ and $\rho_2$ respectively) structure, as shown in part (a) of FIG. 16 into one $Cu/SiO_2$ layer structure, as shown in part (b) of FIG. 16 with area ratio of $\rho'$ from energy flux point of view. As shown in FIG. 17, given thickness of the material and its property, transmission and reflection ratio of electron flux on the thin film are called $T_{material}$ and $R_{material}$ respectively. For required thickness of the material, a table of $T_{material}$ and $R_{material}$ is generated by a scattering simulator based on Monte Carlo method. Using this table and energy flux relation, a procedure for deriving effective area ratio. $\rho'$ and the base model will be described.

Figure 18:
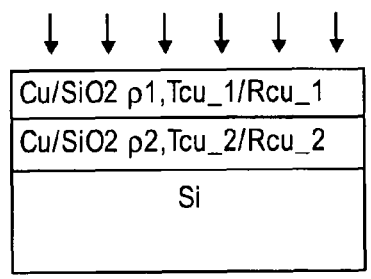
FIG. 18 shows a representation of a scattering model for multi-layers.

At first, the idea is described by an example of two layer structure case depicted in FIG. 18, and then general theory will be explained. Calculation of the electron energy flux ratio of backscattering energy to incidence electron energy will be described at first. Energy flux ratio Ef at the surface of two layer structure shown in FIG. 18 is calculated as follow; (1) reflected flux at the surface of first $Cu/SiO_2$ layer with area ratio $\rho i$ consists of reflection at Copper part $R_{cu\_1}\cdot\rho_1$, and reflection at $SiO_2$ part $R_{SiO2\_1}\cdot(1-\rho_1)$, (2) reflected flux at the surface of second $Cu/SiO_2$ layer with area ratio $\rho_2$ consists of reflection at Copper part $R_{cu2}\cdot\rho_2$, and reflection at $S_iO_2$ part $R_{SiO2\_2}\cdot(1-\rho_2)$, (considering that reflection at the surface of second layer occurs for flux that transmits the first layer, and the reflection is observed at surface of the first layer), the formula for reflection at second layer is, $$\{T_{Cu\_1}*\rho_1+T_{SiO2\_1}*(1-\rho_1)\}^{2}*\{R_{Cu\_2}*\rho_2+R_{SiO2\_2}*(1-\rho_2)\}.$$

Considering reflection at surface of bulk silicon, the total energy flux ratio Ef at the surface of the two layer structure becomes as follows, $$Ef = R_{Cu\_1}*\rho_1 + R_{SiO2\_1}*(1-\rho_1) + \qquad (4)$$
$$\{T_{Cu\_1}*\rho_1 + T_{SiO2\_1}*(1-\rho_1)\}^2 * \{R_{Cu\_2}*\rho_2 + R_{SiO2\_2}*(1-\rho_2)\} +$$
$$\{T_{Cu\_1}*\rho_1 + T_{SiO2\_1}*(1-\rho_1)\}^2 *$$
$$\{T_{Cu\_2}*\rho_2 + T_{SiO2\_2}*(1-\rho_2)\}^2 * R_{Si},$$

where, $R_{Si}$ is reflection rate of electrons at the surface of bulk silicon, $R_{Cu\_n}$ and $T_{Cu\_n}$, are reflection rate and transmitting rate of Cu part of the nth layer respectively, and $R_{SiO2\_n}$ and $T_{SiO2\_n}$ are reflection rate and transmitting rate of $S_iO_2$ part of the nth layer respectively.

A generalized formula of equation (4), following equation (5) is derived, where Tm_n, and Rm_n are transmitting and reflection rate for n-th layer of conductive material m, and Tin and Tin are transmitting and reflection rate for n-th layer of insulating material m, respectively. By formula (5), energy flux ratio Ef of backscattering energy to incident energy flux is, $$Ef=\Sigma[\{R_{m\_n}*\rho_n+R_{i\_n}*(1-\rho_n)\}*\Pi^{n-1}\{T_{m\_k}*\rho_k+T_{i\_k}*(1-\rho_k)\}^2]. \qquad (5)$$

Figure 19:
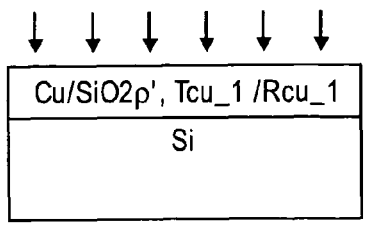
FIG. 19 shows a scattering parameter model for a single layer.

In the base model depicted in FIG. 19, energy flux ratio Ef of back scattering energy to incidence energy flux is, $$Ef'=R_{cu\_1}*\rho'+R_{sio2\_1}*(1-\rho')+\{T_{cu\_1}*\rho'+T_{SiO2\_1}*(1-\rho')\}^2*R_{si}, \qquad (6)$$

where $\rho'$ is effective area ratio of copper.

Let's consider representing energy flux ratio Ef of a structure consisting of multi-layers by simple base model that has one layer, and adjustment using effective area ratio $\rho'$.

$$Ef=Ef' \qquad (7)$$

Let those two be equivalent, the equation (7) is assumed. The equation (7) is considered as a quadratics of $\rho'$ like a form of, $$a(\rho')^2+b\rho'+c=0,$$

where, a, b, and c are, $$a = R_{si} * (T_{Cu\_1} - T_{SiO2\_1})^2$$
$$b = 2 * R_{si} * (T_{Cu\_1} * T_{SiO2\_1} \cdot T^2_{SiO2\_1}) + R_{Cu\_1} - R_{SiO2\_1}$$
$$c = R_{SiO2\_1} + R_{Si} * T^2_{SiO2\_1} - Ef$$
(8)

The thickness of metal layer of the base model is assumed to be equal to the thickness of the top metal layer. Using obtained effective area ratio ρ' and a table for the base model as shown in FIGS. 20A and 20B, $β_b$, and η can be obtained.

Figure 22:
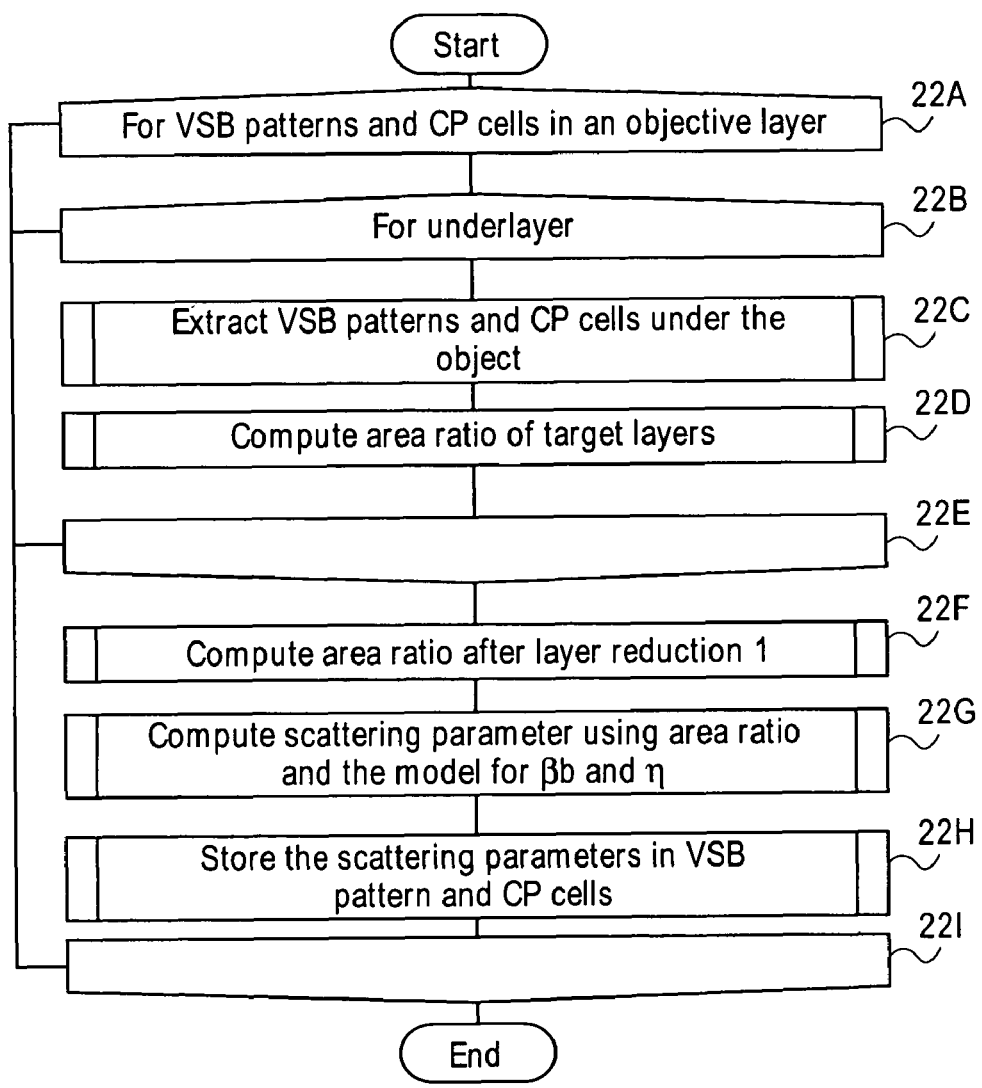
FIG. 22 shows an example of a scattering parameter calculation procedure for CP and VSB by one embodiment of the invention presented herein.

A procedure based on the invented principal is depicted in FIG. 22. In this procedure, all patterns written by VSB and CP cell in an objective area of interest are handled. For each group of patterns written by one shot in the top layer, that is a rectangle of VSB shot or bounding box of CP cell is considered to define a region related to the scattering parameter calculation. Patterns involved in this region are considered for the calculation of the area ratio ρ'for each related layer. Scattering parameters for each region are calculated by using calculated effective area ratio ρ'.

Detail of each step in FIG. 22 is explained step by step:

Step 22A and 22I, 22B and 22E indicate loops of repetitive procedures respectively. Steps between 22A and 22I are repetitively executed for each VSB and CP cell. Steps between 22B and 22E are repetitively executed for underlay structure of a shot either VSB or CP cell. 22E and 22I shows end-indicators for repetitive loops starting from 22B and 22A respectively.

In step 22C, layout patterns under the VSB or CP cell shot are extracted. In step 22D, to compute area ratio of target layout patterns in the region that is a pattern for VSB or CP cell.

In step 22F, layer reduction that transforms multiple layers into one layer by using equivalent area ratio is done.

Figure 23:
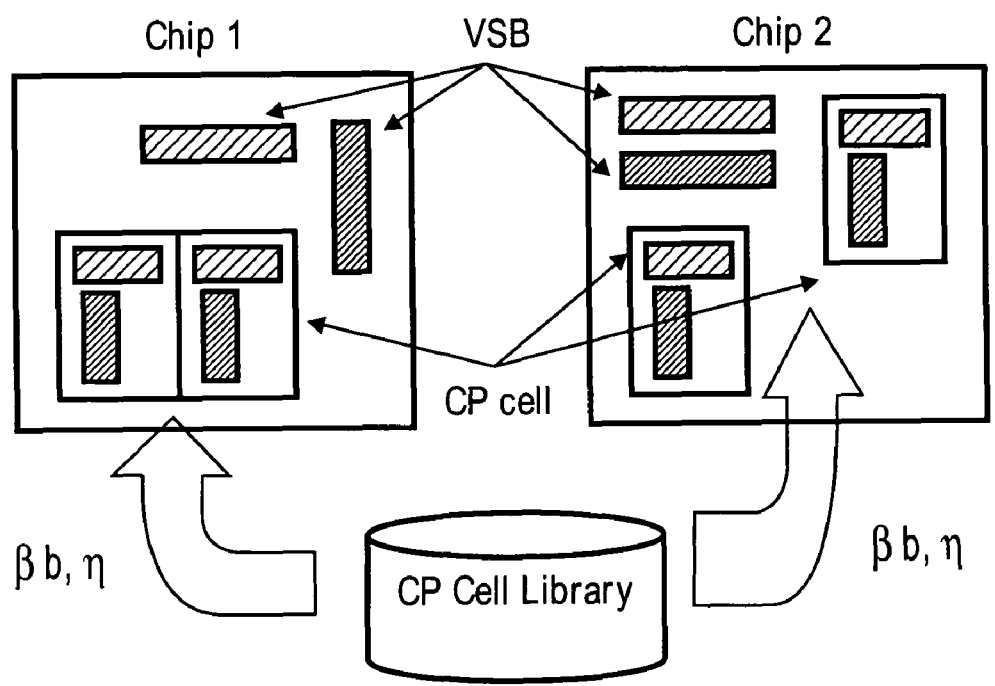
FIG. 23 shows the relation between CP and VSB shot and scattering parameters.
Figure 24:
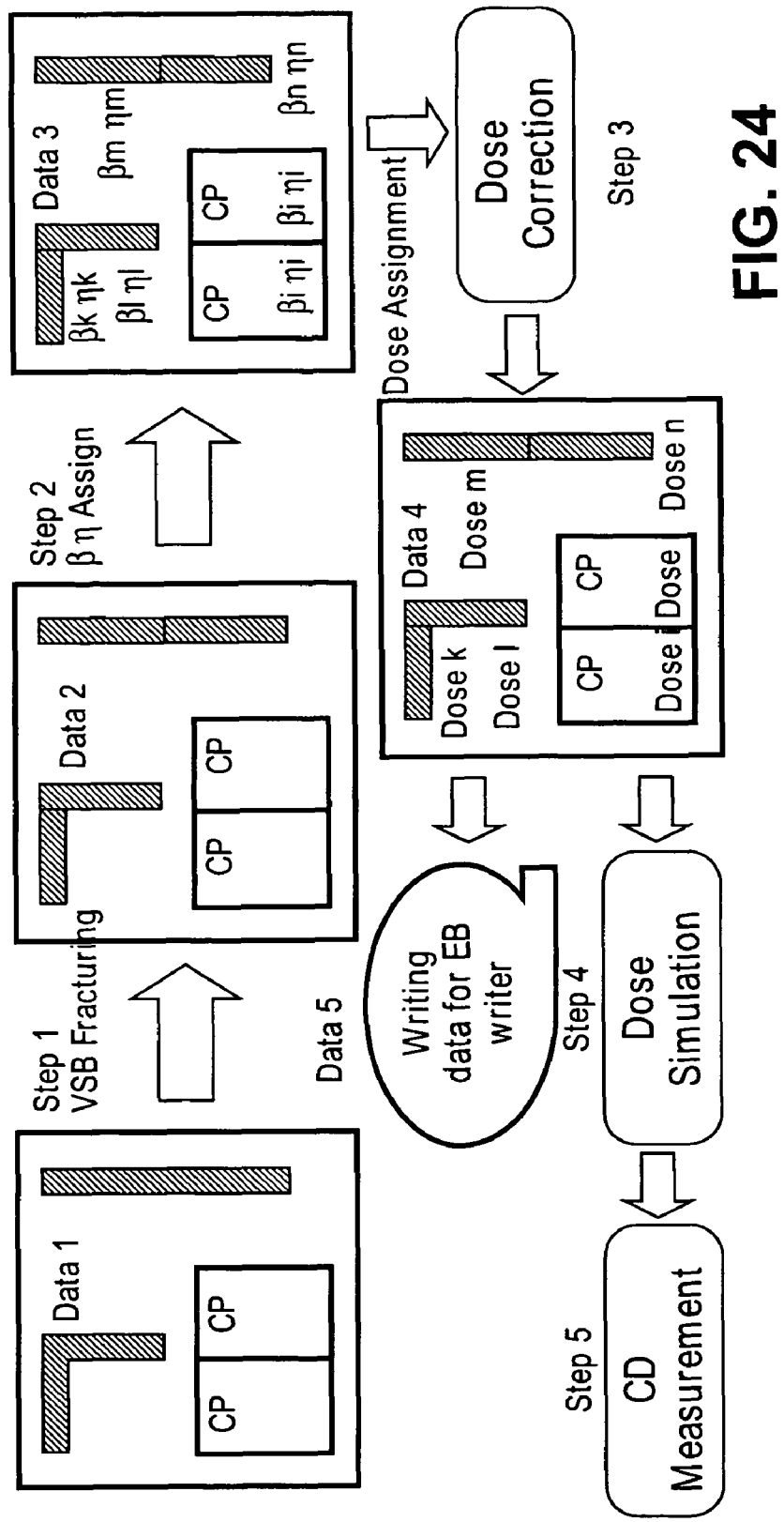
FIG. 24 shows a flow example for simulation, dose correction and data output with back scattering consideration.

In step 22G, scattering parameters for the specified region are computed by using the base model depicted in FIGS. 20A and 20B and the equivalent area ratio. In step 22H, obtained scattering parameters and its relation to VSB or CP shot are stored in storage. FIG. 23 shows the relation between CP and VSB shot and scattering parameters. FIG. 24 shows a flow example for simulation, dose correction and data output with back scattering consideration.

Scattering parameters for each VSB and CP cell, which is obtained by above mentioned procedure are usable for the proximity effect simulator, proximity effect correction program, dose correction program and so on. Outline of these simulator and correction program is explained herein.

Another embodiment of the scattering parameter calculation method described here, an efficient calculation method of scattering parameters for repetitive patterns like CP cell is presented. Referring to FIG. 21, in many CP cells that are derived from standard cell (SC), patterns of layers up to metal 1 are identical despite of the usage of CP cells. In other words, same patterns for metal 1 appear at anywhere the SC is placed. In case CP cell for memory is considered, patterns in upper layers up to metal 4, for example, are fixed or not changed despite of the usage. For such patterns of the metal layers, pre-calculation of area ratio regarding to the CP cell and storing the calculated results and link to the CP cell in storage will save computing resources. In advanced form of this invention, reduction of layer for scattering parameter calculation can be done in advance using effective area ratio. The resultant effective area ratio and link to the CP cell or the group of patterns is stored in storage and will help the scattering calculation. Using this feature of the invention, required CPU time for scattering parameter calculation is significantly reduced. Some CP cells are used for writing repetitively occurred metal wiring and via patterns. Application of the invention to such layer is little bit harder than standard cell and memory case. However, the invention is still applicable for such case, if there are some regular structures under the objective layer of the patterns.

It is helpful for optimizing the design if some results are shown on a display device with keeping relations with layout data. The displayed results include proximity effect correction, dose quantities assigned to writing patterns, scattering range and reflection energy. For example, there occurs a short circuit in an LSI, backscattering parameters shown with layout pattern on the display may help the problem solving. A defect of wiring may be caused by short circuit of two wires by the influence of Tungsten plugs placed in under layers. This type of defect is easily identified if status of backscattering of the under layer is shown with the layout pattern.

Figure 25:
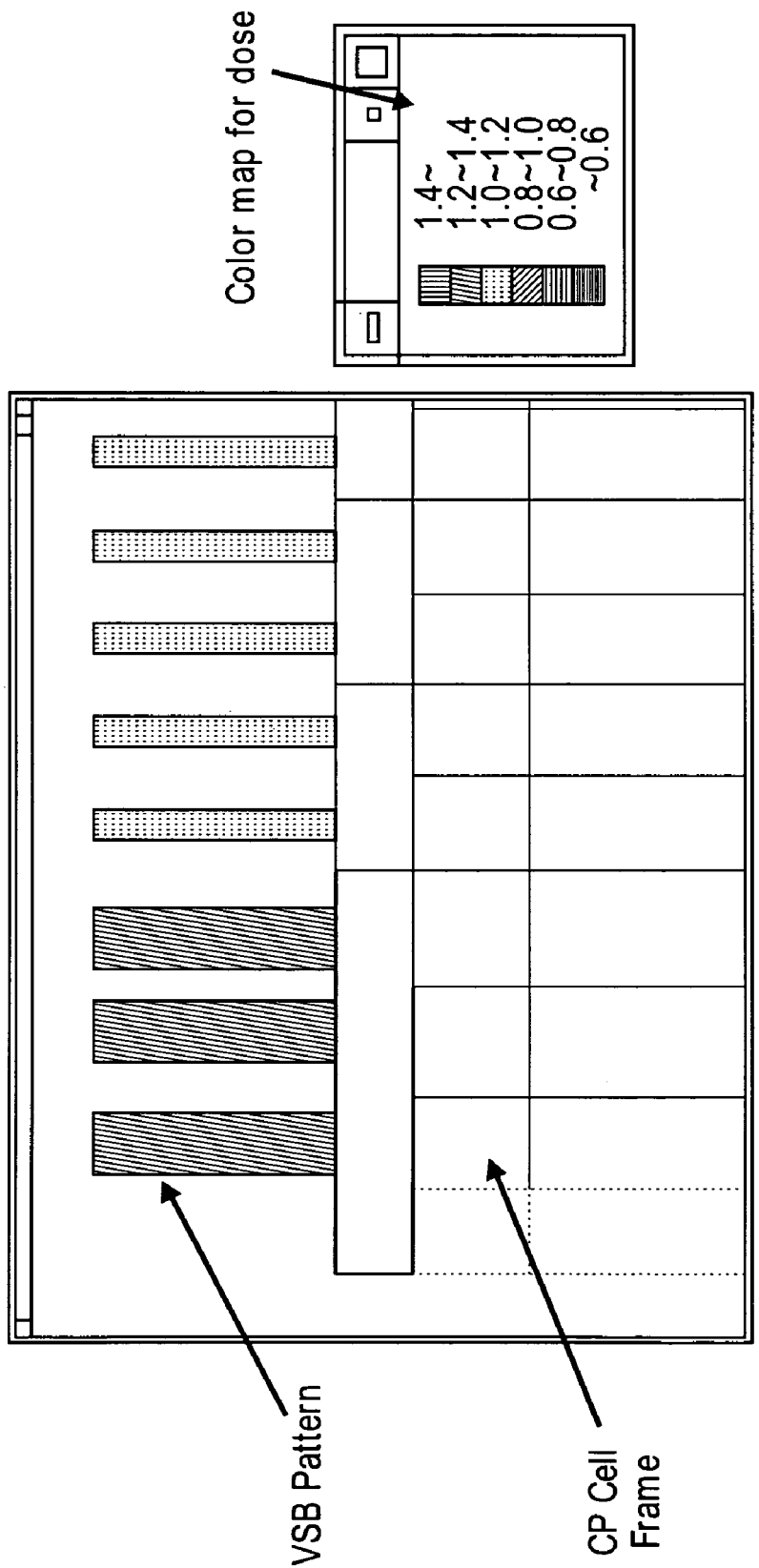
FIGS. 25-26 show a various display examples of a dose correction result.
Figure 26:
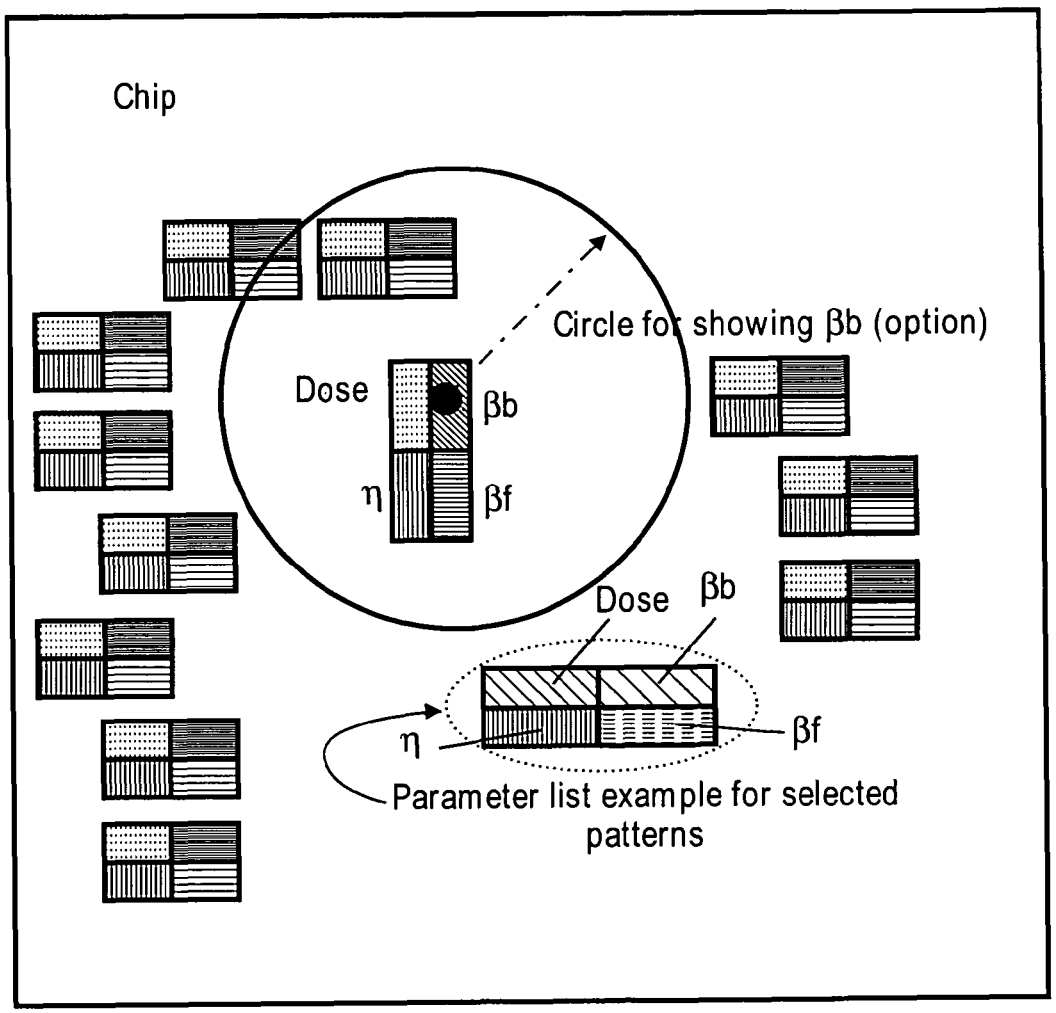

FIG. 25 is an example of displaying dose quantities on patterns written by VSB and CP cell by colors. In another embodiment depicted by FIG. 26, parameters related to the writing are shown by pointing the pattern to be written by VSB or CP with a pointing device, such as a mouse. In this example, dose, forward scattering range, backscattering range, reflection energy ratio, etc. are to be shown on the display devices. FIG. 26 is another embodiment of the display method, by pointing a pattern by a pointing device, a range of backscattering is shown by a circle of backscattering range. This type of intuitive display is helpful for problem solving.

The described invention provides a new solution that is applicable to both writing methods by variable shaped beam (VSB), cell projection (CP) and mixture of those two writing methods. The conventional method mainly focused on the writing method by VSB, and dose not consider to use the feature of CP method. Conventional approximation model for dose correction and the model for backscattering under the resist are not suitable for the writing by CP because the shape of CP cell is not considered in the model. The method by this invention is created inherently suitable for CP writing, and the methods for the approximation model generation and the correction are created so that it is suitable for CP method.

Area density method[1-3] is a conventional method that is used for providing an approximation method for dose correction and lithography simulation, and is to be applicable after the layout is completely fixed. On the contrary, the method by this invention can provide approximation model very effectively by virtue of design hierarchy usage and CP cell based approach. That is, model preparation for a CP cell even that is repetitively used in the design, is completed by once, and the model is simply copied where it is used in the design. In the conventional area density method that divides the objective region by mesh grid without considering repetitiveness of the layout patterns, models for each mesh grid must be created for each. The area density method cannot make a use of hierarchy or repetitiveness information of CP cell usage.

The proximity effect calculation method by this invention, which is a basis of dose and proximity effect correction, can provide accurate solution higher than the conventional area density method without sacrifice of computing time efficiency. The reason is that the representative model, which expresses an influence of an objective region on a point of interest, has a high degree of accuracy. Another benefit of the invented approximation model is its flexibility, that is, different from the conventional area density method, accuracy of the approximation can be increased as required. In the representative rectangle model, approximation accuracy increases with increasing number of representative rectangles. Tuning of the model parameter of the approximation is stable and easy to find the best point.

The invented backscattering model and the calculation method for wiring structure under the resist is suitable for writing by CP cell and VSB, can reduce computing complexity, and is easily implemented in data structure. In conventional model and method, writing by CP is not considered, and benefits for software implementation and easiness of the process are not implemented.

Conventional backscattering model generation of complicated layer structure is time consuming. By the novel method of the invention, the model for complex structure is easily derived from a single layer model characterized by the invented method. By a method of the invention, characterization of one layer is done by few parameters. Calculation of the parameters for a small region of one layer can be also achieved easily and quickly. By the proposed method, both simplification and reduction of CPU time consumption are achievable compared with the conventional ones.

The backscattering model by the invention is suitable for generating model for a group of patterns written by one shot as a unit, which is fit to VSB and CP. Similar to the representative rectangular model for proximity effect calculation, the model is effectively generated by using design hierarchy information. It is important to show a dose correction result in an intuitively understandable manner. The display method by the invention colors VSB or CP patterns that are written by one shot in a way that dose quantity is easily understandable.

The described inventions enable proximity effect correction for particle beam writing. One example is electron beam (EB) writing, which is applicable for VSB, CP and mixture of both writing method. Correction in high degree of precision becomes possible by using not only line width correction or one-dimensional correction but using more flexible two-dimensional correction by pattern. This invention gives a solution for a problem that occurs when correction of a long strip pattern is handled. That is, in one-dimensional correction scheme, minimizing error in one direction (line length for example) means insufficient correction in another direction (line width for example).

By using a calculation method based on the invented approximation model, lithography simulation that calculates lithography image becomes achievable in a short computing time with minimum sacrifice of accuracy.

Moreover, the approximation model by the invention is flexible and expandable. It is easy to improve accuracy of the approximation by adding representative rectangles if high degree of the precision is required.

Backscattering is a reflection effect of electron beam from underlay metal layers and vias. Compared with conventional models, a model by this invention is compact and flexible. In one aspect, by preparing a characteristic table model for a unit layer by measurement or simulation, a scattering model for under resist structure is easily generated.

Even though the above discussion describes the case of EB direct writing (EBDW), application of this invention should not limited to EB direct writing but can be applied to mask writing using an EB writer with the CP capability, in a similar manner, resulting in an improved throughput.

Moreover, it should be appreciated that this invention may also be applied to other drawing technologies using other types of particle beams other than EB, such as an optical (light) laser beam, an X-ray beam, or any other particle beams which runs straight and can stimulate the sensitive material (resist) layer to form patterns on the substrate.

Although particular embodiments of the invention have been shown and described, it will be understood that it is not intended to limit the invention to the preferred embodiments, and it will be obvious to those skilled in the art that various changes and modifications may be made without departing from the scope of the invention. The specification and drawings are, accordingly, to be regarded in an illustrative rather than restrictive sense. The invention is intended to cover alternatives, modifications, and equivalents, which may be included within the scope of the invention as defined by the claims.

What is claimed is:

1. A method of particle beam lithography, comprising:
preparing a stencil design having at least one group of patterns that are corrected for proximity effect by pattern modification;
correcting the proximity effect by at least modifying at least one dose of particle beam shots, wherein
the act of correcting the proximity effect by at least modifying the at least one dose applies to both a variable shaped beam (VSB) writing mode and a cell projection (CP) writing mode, and
the act of correcting the proximity effect by at least modifying the at least one dose of particle beam shots applies to the cell projection writing mode to write the a lithography image of a cell without dividing an area of the cell into grids; and
writing a lithography image by using at least the stencil design and the at least one dose that is modified for the act of correcting the proximity effect, wherein
the act of writing the lithography image is characterized by being capable of being accomplished by either the VSB writing mode or the CP writing mode, or a combination of the VSB writing mode and the CP writing mode.

2. The method of claim 1, wherein edges of the patterns in the group of patterns are moved independently for the correction by pattern modification.

3. The method of claim 2, wherein the edges of the patterns in the group of patterns are moved at non-uniform distances for correction.

4. The method of claim 1, further comprises splitting at least one edge of the patterns in the group of patterns by using an inserted vertex along the at least one edge to modify one or more patterns in the group of patterns.

5. The method of claim 1, wherein proximity effects between the patterns in the group of patterns are corrected by modifying shapes of the patterns in the group of patterns.

6. The method of claim 1, wherein dose intensity for the PEC by pattern modification is made equal to a threshold value of the deposition energy that generates the images by the particle beam.

7. The method of claim 1, wherein particle beam lithography comprises electron beam (EB) lithography, and wherein the particle beam comprises an electron beam.

8. The method of claim 1, wherein particle beam lithography comprises optical (light) laser lithography, and wherein the particle beam comprises an optical (light) laser beam.

9. The method of claim 1, wherein particle beam lithography comprises X-ray beam lithography, and wherein the particle beam comprises an X-ray beam.

10. A method for proximity effect calculation for performing particle beam lithography, comprising:
preparing a group comprising at least two patterns which are to be fabricated by the particle beam lithography; and
defining at least one representative pattern for approximating the proximity effect caused by the group of patterns, wherein a size of the at least one representative pattern is determined based at least in part upon a total area of the group; and performing the particle beam lithography based at least in part upon design analysis of the at least one representative pattern.

11. The method of claim 10, wherein a CP cell is used for the group of patterns.

12. The method of claim 10, wherein the PEC model comprises a minimum circumscribing rectangle for the group of patterns and an area ratio of a total area of cell patterns in the group to an area of the minimum circumscribing rectangle.

13. The method of claim 10, wherein the PEC model comprises at least one representative rectangle for approximating the proximity effect caused by the group of patterns.

14. The method of claim 10, wherein the PEC model comprises at least one mathematical function that is characterized by asymptotically approaching zero with moving to the infinite for approximating the proximity effect caused by the group of cell patterns.

15. A method of particle beam lithography, comprising:
selecting at least two patterns which are to be manufactured by the particle beam lithography;
clustering objective patterns of the at least two patterns into a pattern group;
approximating a proximity effect of the at least two patterns by one or more representative patterns, wherein a size of the one or more representative patterns is determined based at least in part upon a total area of the group; and
performing proximity effect correction (PEC) for the pattern group, wherein the particle beam lithography is performed using the PEC.

16. The method of claim 15, further comprising preparing a proximity effect calculation model for the pattern group.

17. The method of claim 16, wherein the proximity effect calculation model comprises at least one mathematical function that is characterized by asymptotically approaching zero with moving to the infinite for approximating the proximity effect caused by the at least two cell pattern of the pattern group.

18. The method of claim 15, wherein dose quantity of each pattern in the pattern group is copied from that of the representative pattern of the pattern group or is made equal to that of the representative pattern.

19. The method of claim 15, wherein the proximity effect calculation between patterns in the pattern group is achieved using each of the patterns in the pattern group.

20. The method of claim 15, further comprising dividing objective patterns and calculating proximity effect of the divided patterns.

21. The method of claim 20, wherein criteria for dividing objective patterns is determined by a size of a region that is written by the particle beam in one shot.

22. A method of performing particle beam lithography, comprising:
selecting at least two patterns from a writing data to form a pattern group;
storing one or more scattering parameters for the pattern group;
retrieving the scattering parameters of the pattern group for calculating proximity effect;
performing proximity effect correction (PEC) for the pattern group or the pattern using the scattering parameters without requiring an area which comprises the pattern group be divided into meshes, wherein particle beam lithography is performed using the PEC, and the act of performing proximity effect correction is performed by correcting the proximity effect by at least modifying at least one dose of particle beam shots, in which the act of correcting the proximity effect by at least modifying the at least one dose applies to both a variable shaped beam (VSB) writing mode and a cell projection (CP) writing mode, and the act of correcting the proximity effect by at least modifying the at least one dose of particle beam shots applies to the cell projection writing mode to write the a lithography image of a cell without dividing an area of the cell into grids.

23. The method of claim 22, wherein a CP cell is used for the pattern group.

24. The method of claim 22, wherein a cell pattern that is written by the Variable Shaped Beam (VSB) mode is used for the pattern group.

25. A method of particle beam lithography, comprising:
selecting a plurality of patterns from a layout data file to form a plurality of pattern groups;
calculating scattering parameters for each pattern group without dividing the patterns to meshes;
storing the scattering parameters in a storage medium in a manner so as to keep relations between the scattering parameters and the corresponding pattern group;
retrieving the scattering parameters of each pattern group for calculating proximity effect;
performing proximity effect correction (PEC) for each pattern group; and
writing each pattern group after proximity effect correction (PEC), wherein
the proximity effect correction is performed by at least modifying the at least one dose applies to both a variable shaped beam (VSB) writing mode and a cell projection (CP) writing mode, and
the proximity effect correction by at least modifying the at least one dose of particle beam shots applies to the cell projection writing mode to write the a lithography image of a cell without dividing an area of the cell into grids.

26. The method of claim 25, wherein composite scattering parameters for overlapped multiple layers of repetitively used pattern groups are calculated in advance and stored in the storage medium that keeps relations between the scattering parameters and the corresponding pattern group.

27. The method of claim 25, further comprising transforming a structure of multiple layers into an equivalent structure that has less number of layers, generating a base model that comprises an equivalent layer and bulk silicon, and computing scattering parameters from the base model.

28. The method of claim 25, wherein the base model comprises an area ratio as an input, scattering parameters as output, and a model that calculates outputs as a function of the area ratio.

29. A method of particle beam lithography, comprising:
dividing a writing region into a plurality of regions, wherein the plurality of regions are defined as a shape of a VSB shot or a bounding box of a CP cell;
calculating a scattering parameter of each region using underlay patterns in each region of the plurality of regions;
correcting proximity effect by modifying at least one dose for writing the writing region with a cell projection writing mode based at least in part upon the scattering parameter for the each region of the plurality of regions;

storing the calculated scattering parameters in a storage medium in a manner so as to keep relations between each region and the scattering parameters; and computing required information in a data structure using the scattering parameters.

30. The method of claim 29, wherein a same region is used in common through all layers, and the calculation of scattering parameters at a layer is performed using scattering parameters for the underlay structure.

31. The method of claim 29, further comprising generating a predetermined model that calculates scattering parameters of a specified region using LSI design parameters of the specified region as inputs, and generating a procedure that returns the scattering parameter of a given position of the LSI layout by using the predetermined model.

32. The method of claim 31, further comprising generating an energy flux model that uses at least a kind of material used in each layer of the LSI, the thickness of each layer as inputs, and calculates the rate of particle energy flux transmitting and the rate of particle flux reflection.

33. The method of claim 31, further comprising a scattering parameter model that uses a kind of material used in each layer of the LSI, the thickness of each layer, and an area ratio that is defined as a ratio of area occupied by objective material to the area of specified region as inputs, and calculates backscattering range and backscattering energy ratio of backscattering to forward scattering energy.

34. The method of claim 31, further comprising dividing an objective region of the LSI by a plurality of regions and calculating scattering parameters of each region.

35. The method of claim 29, further comprising extracting VSB patterns and CP cells located under specified VSB patterns or CP cells, calculating an area ratio, transforming multiple layers into an equivalent layer by using compensated area ratio, and calculating scattering parameters based on the compensated area ratio.

36. A method of particle beam lithography, comprising:
correcting proximity effect by dose control, wherein the dose control modifies at least one dose of particle beam shots for both a variable shaped beam (VSB) writing mode and a cell projection (CP) writing mode;
correcting proximity effect by pattern modification for a group of at least two patterns; and
displaying information related to proximity effect correction (PEC) for the particle beam lithography by displaying the information at a position related to a layout pattern required by an operator, wherein
the information includes a proximity effect simulation image, one or more correction results, and one or more parameters required for simulation and correction of the proximity effect, and
the information is characterized by being capable of applying to both the variable shaped beam (VSB) writing mode and the cell projection (CP) writing mode, each of the variable shaped beam writing mode and the cell projection writing mode uses the information in printing an image.

37. The method of claim 36, wherein one or more representative patterns for approximating proximity effect of specified patterns, a value of calculated dose quantity and parameters required for proximity effect calculation are displayed by means of coloring of patterns and shape.

38. The method of claim 36, wherein a range related quantity of proximity effect is displayed by overlaying a figure in a scale similar to the displayed patterns by pointing to a pattern of interest.

39. The method of claim 36, further comprising displaying dose quantity obtained by dose correction at a position related to the pattern and displaying an image obtained by the simulation based on the calculated dose in a position related to the original pattern of a chip area, wherein the information is displayed simultaneously or independently.

40. The method of claim 36, further comprising displaying scattering parameters including backscattering range and energy ratio of backscattering to forward scattering at a position that is related to a region or pattern of interest.

* * * * *